United States Patent
Asadi et al.

(10) Patent No.: US 9,666,758 B2
(45) Date of Patent: May 30, 2017

(54) METHOD FOR PRODUCING LIGHT EMITTING SEMICONDUCTOR DEVICE

(71) Applicant: KONINKLIJKE PHILIPS N.V., Eindhoven (NL)

(72) Inventors: Kamal Asadi, Eindhoven (NL); Dagobert Michel De Leeuw, Mainz (DE); Johannes Franciscus Maria Cillessen, Deurne (NL); Wilhelmus Cornelis Keur, Weert (NL); Frank Verbakel, Helmond (NL); Patrick John Baesjou, Eindhoven (NL); Cornelis Eustatius Timmering, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/177,542

(22) Filed: Jun. 9, 2016

(65) Prior Publication Data
US 2016/0293799 A1 Oct. 6, 2016

Related U.S. Application Data

(62) Division of application No. 14/409,031, filed as application No. PCT/IB2013/055325 on Jun. 28, 2013, now Pat. No. 9,385,264.
(Continued)

(51) Int. Cl.
*H01L 33/00* (2010.01)
*H01L 33/14* (2010.01)
(Continued)

(52) U.S. Cl.
CPC .......... *H01L 33/145* (2013.01); *C09K 11/643* (2013.01); *H01L 33/0037* (2013.01);
(Continued)

(58) Field of Classification Search
CPC .................. H01L 33/0037; H01L 33/0087
See application file for complete search history.

(56) References Cited

U.S. PATENT DOCUMENTS

| 4,278,913 A | 7/1981 | Kagami et al. |
| 4,916,496 A | 4/1990 | Tomomura et al. |

(Continued)

FOREIGN PATENT DOCUMENTS

JP    2007045926 A    2/2007

OTHER PUBLICATIONS

EPO as ISA, PCT/IB2013/055325 filed Jun. 28, 2013, "International Search Report and Written Opinion", mailed Jan. 14, 2014, 12 pages.
(Continued)

*Primary Examiner* — Dung Le

(57) ABSTRACT

Method for producing a light emitting semiconductor device comprising a zinc magnesium oxide based layer as active layer, wherein the zinc magnesium oxide based layer comprises an aluminum doped zinc magnesium oxide layer having the nominal composition $Zn_{1-x}Mg_xO$ with 1-350 ppm Al, wherein x is in the range of $0<x\leq0.3$. The invention further provides a method for the production of such aluminum doped zinc magnesium oxide, the method comprising heat treating a composition comprising Zn, Mg and Al with a predetermined composition at elevated temperatures, and subsequently annealing the heat treated composition to provide said aluminum doped zinc magnesium oxide.

6 Claims, 10 Drawing Sheets

Related U.S. Application Data

(60) Provisional application No. 61/739,165, filed on Dec. 19, 2012, provisional application No. 61/665,968, filed on Jun. 29, 2012.

(51) Int. Cl.
| | | |
|---|---|---|
| *H01L 33/36* | (2010.01) | |
| *H01L 33/28* | (2010.01) | |
| *C09K 11/64* | (2006.01) | |
| *H05B 33/14* | (2006.01) | |
| *H01L 33/02* | (2010.01) | |
| *H01L 33/16* | (2010.01) | |
| *H01L 33/50* | (2010.01) | |

(52) U.S. Cl.
CPC ...... *H01L 33/0087* (2013.01); *H01L 33/0095* (2013.01); *H01L 33/025* (2013.01); *H01L 33/16* (2013.01); *H01L 33/28* (2013.01); *H01L 33/285* (2013.01); *H01L 33/36* (2013.01); *H05B 33/14* (2013.01); *H01L 33/502* (2013.01); *H01L 2933/0016* (2013.01)

(56) References Cited

U.S. PATENT DOCUMENTS

| | | |
|---|---|---|
| 2004/0222736 A1 | 11/2004 | Yoneda |
| 2004/0222737 A1* | 11/2004 | Raychaudhuri ..... H01L 51/5092 313/504 |
| 2005/0006641 A1 | 1/2005 | Tung et al. |
| 2006/0017055 A1* | 1/2006 | Cropper ............... H01L 51/56 257/77 |
| 2009/0165846 A1 | 7/2009 | Johannes et al. |
| 2010/0163864 A1 | 7/2010 | Shibata et al. |
| 2012/0074399 A1 | 3/2012 | Den Boer |

OTHER PUBLICATIONS

Hauser et al, "Absolute External Luminescense Quantum Efficiency of Zinc Oxide", Applied Physics Letters 92 (2008), 3 pages.

Hofmann et al, "Properties of the Oxygen Vacancy in ZnO", Appl. Phys. A88 (2007), p. 147-151.

Likovich et al, "Narrow Band Defect Luminescence from Al-Doped ZnO Probed by Scanning Tunneling Chathodoluminescence", Applied Phys. Letters 99, (2011), 4 pages.

Liu et al., "Annealing Temperature Dependent Electrical and Optical Properties of ZnO . . . ", Applied Surface Science 255 (2009), p. 6745-6749.

Lorenze et al., "Optical and Electrical Properties of Epitaxial (MdCd) O, ZnO, and ZnO Thin Films . . . ", Solid State Electronics 47 (2003) p. 2205-2209.

Pan et al., "Temperature Dependent Hall and Photoluminescence Evidence for Conduction-band Edge . . . ", Applied Physics Letters 95 (2009), 4 pgs.

Sharpe et al., "A Luminous Efficiency Function . . . ", Journal of Vision (2005) 5, p. 948-968.

Van Dijken et al, "Identification of the Transition Responsible for the Visible Emission in ZnO Using Quantum Size Effects", Journal of Luminescense 90 (2000), p. 123-129.

Vanheusden et al., "Mechanisms Behind Green Photoluminescence in ZnO Phosphor Powders", J. Appl. Phys 79 (10), May 15, 1996, 9 pgs.

VonWenckstern et al., "Anionic and Cationic Substitution in ZnO", Progress in Solid State Chemistry, 37 (2009) p. 153-172.

Wu et al., "Surface Modifications of ZnO Quantum Dots for Bio-Imaging", Nanotechnology 18 (2007) 215604. 9 pgs.

Yoon et al., "Electroluminscence from n-n Isotype Heterostructures of Graded-band-gap ZnMgo : Al and ZnO Films on Platinized Si", Journal of Physics D: Applied Physics, 44, published Sep. 27, 2011, 415402, 6 pages.

Office Action mailed 31 Jan. 31, 2017, Japan Patent Application No. 2015-519462, 6 pages.

* cited by examiner

METHOD FOR PRODUCING LIGHT EMITTING SEMICONDUCTOR DEVICE

CROSS-REFERENCE TO RELATED APPLICATIONS

The present application is a divisional of U.S. patent application Ser. No. 14/409,031 filed on Dec. 18, 2014, titled "II-VI BASED LIGHT EMITTING SEMICONDUCTOR DEVICE", which is a §371 application of International Application No. PCT/IB2013/055235 filed on Jun. 28, 2013, which claims priority to U.S. Provisional Patent Application No. 61/739,165 filed on Dec. 19, 2012 and U.S. Provisional Patent Application No. 61/665,968 filed on Jun. 29, 2012. U.S. patent application Ser. No. 14/409,031, International Application No. PCT/IB2013/055325, U.S. Provisional Patent Application No. 61/739,165, and U.S. Provisional Patent Application No. 61/665,968 are incorporated herein.

FIELD OF THE INVENTION

The invention relates to a II-VI based light emitting semiconductor device, a luminescent material, a method for the production of such luminescent material, as well as to a method for the production of a II-VI semiconductor layer for such semiconductor device.

BACKGROUND OF THE INVENTION

Wide-band gap II-VI compounds are expected to be one of the most vital materials for high-performance optoelectronics devices such as light-emitting diodes (LEDs) and laser diodes (LDs) operating in the blue or ultraviolet spectral range. Thin films were commonly grown using the conventional vapor-phase epitaxy (VPE) method. With the development of science and technology, new and higher requirements arose for material preparation. For this reason, novel epitaxial growth techniques were developed, including hot-wall epitaxy (HWE), metal organic chemical vapor deposition (MOCVD), molecular-beam epitaxy (MBE), metal organic molecular-beam epitaxy (MOMBE) and atomic layer epitaxy (ALE). Using these growth methods, film thickness can be controlled and quality can be improved. Examples of II-VI semiconductors are ZnS, ZnO, ZnSe, ZnTe, and CdTe.

Zinc oxide semiconductor materials comprising zinc and oxygen as constituent elements have attracted considerable attention since they can emit not only blue light but also near ultraviolet rays of 400 nanometers or less because of their wide band gap similarly to semiconductor materials such as gallium nitride and the like. Further, their applications to photo detector, piezoelectric device, transparent conductive electrode, active device and the like have also been expected without being limited to light emitting device. To form such a zinc oxide semiconductor material, various methods such as MBE method using ultra-high vacuum, sputtering, vacuum evaporation, sol-gel process, MO-CVD method, and the like have been conventionally examined. With respect to the light emitting device, the MBE method using ultra-high vacuum is widely used from the viewpoint of crystallinity.

Further, U.S. Pat. No. 4,278,913 describes a zinc oxide-based phosphor emits yellow light of high luminance under excitation of low-velocity electrons: $xMIIF2.yMIIIF3.ZnO$ wherein MII is at least one divalent metal selected from the group consisting of beryllium, magnesium, calcium, strontium, barium, zinc and tin, MIII is at least one trivalent metal selected from the group consisting of aluminum, gallium, indium, thallium, yttrium and antimony, and x and y are numbers satisfying the conditions of $0.0001 \leq x+y \leq 0.1$, $0 \leq x$ and $0 < y$. The zinc oxide-based phosphor is used as a fluorescent screen of a low-velocity electron excited fluorescent display device.

SUMMARY OF THE INVENTION

Currently, the lighting world is in the middle of a transition from the incandescent bulbs and (compact) fluorescent lamps towards solid-state lighting, mostly provided by light emitting diodes (LEDs). The majority of the LEDs in market are based on gallium nitride (GaN). While GaN is an excellent emitter, it does suffer from several drawbacks. The main issue is the susceptibility to defects in the crystal lattice that are generally detrimental for the emissive properties of GaN layers. Yet, GaN is the most suitable III-V material for LED fabrication because is actually one of the more defect-tolerant III-V materials. In order to prevent emission loss, the defect concentration has to be kept low by growing the GaN layers epitaxially. Epitaxial growth however prevents fabrication of large area devices. Additionally, the GaN covered wafers are generally cut up into small parts (typically 1×1 mm) to ensure an acceptable yield in functional devices, and to ensure optimum use of materials, because of the fact that gallium is a relatively scarce and expensive element.

The requirement for small areas has several disadvantages. In order to have enough light output GaN LEDs are generally operated at high power densities leading to heating of the devices which decreases their efficiency and requires the use of heat dissipation mechanisms such as heat sinks. The high light output from a small area effectively makes them point sources, which makes it uncomfortable to look directly into when used for general lighting applications. In fact, high power LEDs are classified on par with lasers with respect to eye safety. Therefore, for lighting applications, some kind of light spreading and glare reduction is generally required. An approach to solve these issues is to have large light emitting surfaces that can be driven at much lower power densities. As mentioned above, a large-area GaN light source is currently impossible and does not exist.

One of the reasons for the vulnerability for defects in the GaN crystal lattice stems from the low exciton binding energy, which is below kT. This low value means that at room temperature, excitons are likely to split up in separate electrons and holes before they have a chance to radiatively recombine. The separated charge carriers are then trapped at defect sites, leading to non-radiative decay. Obviously, this process intensifies at the elevated temperatures that GaN LEDs are commonly operated at.

On the other side of the spectrum are organic LEDs (OLEDs) with an exciton binding energy of 0.5 eV, far larger than kT, enabling light emission from an essentially amorphous medium which makes large area lighting applications possible. OLEDs however require (expensive) encapsulation due to the reactive nature of the electrode materials used.

Zinc oxide has long been studied as a material that may have the best of both worlds. Like GaN, it is a wide band gap semiconductor (~3.3 eV), but ZnO has a high exciton binding energy of 60 meV (2.4 times kT at room temperature). This value means that defects should be less detrimental to light emission, thereby enabling a switch from epitaxial growth methods towards cheaper, large area deposition techniques like sputtering that generally result in polycrystalline layers. Furthermore, ZnO is cheap, abundant and highly stable making it an attractive choice as a potential light emitting material in large area devices.

Zinc oxide can be applied using large area deposition techniques like sputtering, which generally results in polycrystalline layers. Furthermore, ZnO is cheap, abundant and highly stable, making it an attractive choice as a potential light emitting material in large area devices. However, despite these promises, ZnO has a few issues as a potential phosphor that have not been solved yet. Firstly, the main (near band gap) emission is in the UV (~385 nm) and secondly the quantum efficiency of this emission is very low. Up to 3% efficiency has been reported from powder at room temperature, but generally lower values are observed.

A well-known additive is sulfur, which results in a strong, broad band emission from ZnO centered around 500 nm with a quantum efficiency of ~50%. Although the preparation of highly luminescent ZnO:S powder is rather straightforward, the deposition of thin films of a similar composition is troublesome.

Therefore, there is an interest in additives for ZnO that improve the visible emission and quantum efficiency of the material, while being compatible with large area deposition techniques like sputtering. Hence, it is an aspect of the invention to provide an alternative (light emitting) semiconductor device, which preferably further at least partly obviates one or more of above-described drawbacks. It is further an aspect of the invention to provide an alternative luminescent material, which preferably further at least partly obviates one or more of above-described drawbacks. Further, it is an aspect to provide a method for the production of such luminescent material, especially in the form of a layer on a substrate that can be used as active layer in such alternative semiconductor device.

In a first aspect, the invention provides a light emitting semiconductor device comprising a stack, the stack comprising a cathode (which may especially be a cathode layer), a semiconductor layer comprising an emissive (oxidic) material having an emission in the range of 300-900 nm, an (oxidic) insulating layer, and an anode (which may especially be an anode layer), wherein the cathode is in electrical contact with the semiconductor layer, wherein the anode is in electrical contact with the insulating layer, such as a metal oxide layer, and wherein the insulating layer has a thickness in the range of up to 50 nm (i.e. >0 nm and ≤50 nm).

This approach is a realization of the diode by incorporation of an insulating layer in the device stack, i.e. metal-insulator-semiconductor-metal (MISM) diode. The cathode or anode can in principle be of any material that is suitable as cathode or anode material, respectively. Especially, at least one of cathode or anode is transmissive. In an embodiment, the cathode comprises ZnO doped with aluminium or indium tin oxide (ITO). Hence, in an embodiment, the cathode is transmissive. Herein, the term "transmissive" indicates that the layer is transmissive for emission of the active layer. In a further embodiment, the anode may be a noble metal, such as gold or platinum, or a combination thereof.

Suitable materials for the semiconductor layer may especially be an emissive material selected from the group consisting of oxides, sulfides or selenides of zinc or cadmium, such as zinc oxide, zinc magnesium oxide, zinc sulfide, zinc selenide, cadmium oxide, cadmium sulfide, and cadmium selenide, especially ZnO, (Zn,Mg)O, ZnS, ZnSe, CdO, CdS, CdSe. Further, also oxysulfides may be applied, like gadolinium oxy sulfide. Further, also doped version of these materials may be applied, like ZnO:Al, (Zn,Mg)O:Al, ZnO:Mn, (Zn,Mg)O:Mn, etc. Hence, in an embodiment, the emissive material is selected from the group consisting of ZnO, (Zn,Mg)O, ZnS, ZnSe, CdO, CdS, CdSe, and doped variants of any of these, (like ZnO:Al, (Zn,Mg)O:Al, ZnO:Mn, (Zn,Mg)O:Mn, etc.). Also other semi-conducting materials may be applied that show emission in the visible. Optionally, also tellurides, like ZnTe, might be applied.

Hence, in a specific embodiment, the semiconductor layer comprises an emissive material selected from the group consisting of zinc (magnesium) oxide and cadmium oxide. The semiconductor layer is herein also indicated as "active layer". In an embodiment, the layer is a non-granular layer, such as a layer obtainable by CVD or sputtering (and annealing), or other techniques known in the art, such as described herein. However, in another embodiment, the layer comprises a particulate layer, such as a layer comprising semiconducting nanoparticles. In another embodiment, the layer comprises (semi conducting) quantum dots. The layer is especially a continuous layer, with a porosity of at maximum 5%.

The term "(oxidic) emissive material" indicates that the emissive material may be a metal oxide material, such as ZnO. However, the emissive layer may also comprise a sulphide or selenide emissive material, etc., see also above.

The semiconductor layer comprises an emissive material having an emission in the range of 300-900 nm, such as in the range of 300-800 nm, like 400-700 nm. Especially, the semiconductor layer has at least part of its emission in the visible part of the optical spectrum. Likewise, this may apply to the luminescent material as described below.

The term white light herein, is known to the person skilled in the art. It especially relates to light having a correlated color temperature (CCT) between about 2000 and 20.000 K, especially 2700-20.000 K, for general lighting especially in the range of about 2700 K and 6500 K, and for backlighting purposes especially in the range of about 7000 K and 20.000 K, and especially within about 15 SDCM (standard deviation of color matching) from the BBL (black body locus), especially within about 10 SDCM from the BBL, even more especially within about 5 SDCM from the BBL. The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-590 nm. The terms "orange light" or "orange emission" especially relate to light having a wavelength in the range of about 590-620. The terms "red light" or "red emission" especially relate to light having a wavelength in the range of about 620-750 nm. The terms "visible" light or "visible emission" refer to light having a wavelength in the range of about 380-750 nm.

Specific embodiments of the active layer (material) are elucidated below, but first the insulating layer is discussed.

As indicated above, especially good results are obtained due to the presence of the (oxidic) insulating layer, which may also be indicated as barrier layer. The term "oxidic insulating layer" indicates that the barrier layer is a metal oxide layer. This layer may also comprise a plurality of layers, optionally of different metal oxides. The term "metal oxide" may also refer to a mixed metal oxide. This insulating layer should preferably not influence the optical properties of the active layer. In other words, the insulating layer should preferably not influence the emission position of the emission band of the active layer. Especially, the insulating layer or barrier layer does not substantially react with the active layer, also not during application of the insulating layer on the active layer or during application of the insulating layer on the active layer ("inverted structure"). Hence, it is highly desirable to have a blocking layer that is stable in air and does not intermix with the underlying active layer, such as ZnO phosphor layer (see below) upon annealing (see also below). A good candidate for such layer is ZrO, which is a stoichiometric oxide with very limited solubility in ZnO. Especially, the oxidic insulating layer is selected from the group consisting of $SiO_2$, MgO, $SrTiO_3$, $ZrO_2$, $HfO_2$, and $Y_2O_3$. In a further variant, the insulating layer is a high bandgap dielectrical material, such as with a bandgap of at least 5 eV, especially at least 5.5 eV. The insulating layer may also comprise a non-oxidic material.

It is further desired that the position of the valence band and conduction band of the insulating layer is positioned such that conduction band of the (material of the) insulating layer is higher than of the conduction band of the (material of the) active layer. Further, the position of the valence band of the (material of the) insulating layer may be in the vicinity of the valence band of the (material of the) active layer.

Especially, the emissive material has a conduction band at $CB_p$ eV and a valence band at $VB_p$ eV from the vacuum level, with $CB_p > VB_p$, wherein the barrier layer has a conduction band at $CB_b$ eV and a valence band at $VB_b$ eV from the vacuum level, with $CB_b > VB_b$, wherein $CB_b > CB_p$, especially wherein $CB_b \geq CB_p + 0.25$ eV. Further, in an embodiment especially $VB_b \leq VB_p + 1.5$ eV, even more especially $VB_b \leq VB_p + 1$ eV. The vacuum level at 0 V is taken as reference.

Vc and Vb usually have negative values. Therefore, when Vc>Vb this implies that that |Vc| is smaller than |Vb|. Such conditions may give best results in terms of efficiency of the device. For instance, a conduction band of the barrier layer that is too close to, or even below the conduction band of the active layer may lead to an inefficient light emission in comparison with a barrier layers as indicated above, because the barrier required for blocking electron transport in the active layer has been disappeared. Especially, $CB_b \geq CB_p + 0.35$ eV, even more especially, $CB_b \geq CB_p + 0.5$ eV. Further, as indicated above especially $VB_b \leq VB_p + 1.5$ eV, even more especially $VB_b \leq VB_p + 1$ eV.

To give an example, the emissive material (of the active layer) may have a conduction band at −4 eV and a valence band at −7 eV; hence $CB_p > VB_p$. Further, the barrier layer may e.g. have a conduction band at −3 eV and a valence band at e.g. −6 eV, or −8 eV. Hence, $CB_b > VB_b$. Further, also $CB_b \geq CB_p + 0.25$ eV and $VB_b \leq VB_p + 1$ eV apply.

Especially, the thickness of the insulating layer is within the tunneling limit. Hence, the insulating layer has a thickness which is especially equal to or smaller than 50 nm, such as equal to or smaller 30 nm, like especially in the range of 2-30 nm, like at least 4 nm.

Here, we present also a novel class of zinc oxide based phosphors with enhanced quantum efficiency and emission in the visible part of the spectrum, that are also amenable to robust, large area thin layer deposition techniques such as sputtering, and which may also be used as material for an active layer in above described device. The enhanced emission is achieved by incorporating both magnesium and a trace amount of aluminum, followed by annealing in a non-reducing atmosphere, especially in air. The enhanced emission does not seem to stem from either the Al or Mg themselves, but is attributed to radiating defects in the (modified) ZnO lattice, the nature and number of which are thought to be influenced by the additives. The presence of both Al and Mg seem to have a synergistic effect. These ZnO based materials are prospective candidates for the emissive layer in large area LEDs. The emissive layer is herein also indicated as "active layer". The term "active layer" indicates that this layer in the semiconductor device will show the desired luminescence (emission), when the semiconductor device is driven under the right conditions. The layer is especially a thin film, such as having a thickness in the range of 50 nm-1000 nm (1 μm). The layer is especially a continuous layer, with a porosity of at maximum 5%.

In a further aspect, the invention provides a (light emitting) semiconductor device (herein also indicated as "device") comprising a zinc oxide or zinc magnesium oxide based layer, especially a zinc magnesium oxide based layer, as active layer, wherein the zinc magnesium oxide based layer comprises (or especially consists of) an aluminum doped zinc magnesium oxide layer having 1-350 ppm Al. The zinc magnesium oxide of the aluminum doped zinc magnesium oxide layer is of the type ZnO; thus more precisely (Zn,Mg)O; i.e. especially a (Zn,Mg)O:Al layer is provided. Instead of, or in addition to the Al dopant, also other dopants may be applied, like Mn (manganese).

Especially, the invention provides a semiconductor device comprising a zinc magnesium oxide based layer as active layer, wherein the zinc magnesium oxide based layer comprises (even more especially consists of) an aluminum doped zinc magnesium oxide layer having the nominal composition $Zn_{1-x}Mg_xO$ with 1-350 ppm Al, wherein x is in the range of $0 < x \leq 0.3$. The phrase "$Zn_{1-x}Mg_xO$ with 1-350 ppm Al" may also be, as known in the art, indicated as $Zn_{1-x}Mg_xO$:Al (1-350 ppm). Here, the term "nominal composition" is applied, as the composition herein indicated relates to the composition as weighed in. Hence, the nominal composition might also be indicated as "$(1-x)ZnO*xMgO$ with 1-350 ppm Al".

It appears that a relative highly efficient active layer is provided, that has the desired properties in respect of efficiency and electrical resistance. Further, such layer may be produced relatively easy. Layers without Mg or without Al are less efficient. Further, layers having a higher Al content may have undesired conductive properties.

It seems that Mg (magnesium) may at least partly be built in the ZnO lattice (alternatively, one may say that MgO dissolves in the ZnO lattice). The amount of Mg in the nominal composition is indicated with x, which is especially in the range of $0 < x \leq 0.3$, and even more at maximum 0.2. In the range of $0.02 < x \leq 0.2$ best optical properties may be obtained. The intrinsic value for x may especially be 0.1-0.2, like about 0.15 for a layer, whereas for a poly crystalline material, the value for x may especially be 0.04 or lower. The intrinsic value refers to the x-value of the mixed oxide. The presence of Mg in the zinc oxide can be determined from XRD (x-ray diffraction), or SIMS, RBS or ICP/MS, see also below.

With respect to Al (aluminum), it seems that 1-350 ppm (parts per million) Al, especially 1-200 ppm, even more especially 1-100 ppm, give good optical properties and also does not lead to a high conductivity, which is not desired, and which may occur when high Al amounts are used. An amount of Al in the range of 2-100 ppm, such as 5-100 may be especially suitable, even more a range of 2-80 ppm, such as 2-70, such as 10-60 ppm, like 20-60 ppm, especially like 30-50 ppm can be used. In an embodiment, the aluminum content is at least 10 ppm. Aluminum may partly be present in the zinc magnesium oxide lattice as dopant. Al may replace Zn or Mg lattice positions or may form or occupy interstitial positions in the lattice. The presence of Al can be reflected in SIMS (Secondary Ion Mass Spectrometry) or RBS (Rutherford backscattering) of the material. Optionally also laser ablation with ICP/MS (Inductively Coupled Plasma Mass Spectrometry) can be used to detect the presence of Al. The ppm value of the dopant relates to the total molar amount of the system. Hence, 10 µmol Al in 1 mole Zn1-xMgxO:Al will lead to a value of 10 ppm Al, i.e. Zn1-xMgxO:Al (10 ppm).

Hence, in a specific embodiment the zinc magnesium oxide contains 5-100 ppm Al, wherein x is in the range of $0.02<x\leq0.2$ (nominal composition). Further, especially the sulfur content in the zinc magnesium oxide (based layer) is lower than 50 ppm. Higher sulfur contents may lead to systems that cannot easily form the desired composition of the layer. For semiconductor applications, the layer thickness of the aluminum doped zinc magnesium oxide layer may be in the range of 50-1000 nm, such as at least 100 nm. The way in which such active layers may be formed is further elucidated below.

A semiconductor device, with such aluminum doped zinc magnesium oxide layer active layer can advantageously be used to generate visible light, especially having a dominant wavelength in the wavelength range of 500-650 nm. The term dominant wavelength indicates that the emission intensity maximum is found within the indicated spectral region. Further, it appears that the aluminum doped zinc magnesium oxide layer having the nominal composition Zn1-xMgxO with 1-350 ppm Al, wherein x is in the range of $0<x\leq0.3$, can advantageously be used as active layer in a large area LED, the large area LED at least having a die area of at least 1 cm2.

The premise of ZnO is application in large area lighting due to the exciton binding energy of 60 meV being larger than kT. In III-V LEDs (such as GaN), the binding energy is smaller than kT. Hence, for a high photoluminescence efficiency non-radiative defects have to be avoided. Epitaxially grown thin films are required; the technology cannot be scaled up to large areas. In OLEDs however, the exciton binding energy is about 0.5 eV. Light can be generated in amorphous films that are fabricated by roll-to-roll processing. The challenge for OLEDs is cost price and encapsulation.

The large binding energy makes ZnO a defect tolerant host material. Epitaxial thin films are not needed; a high efficiency might be obtained with polycrystalline thin films deposited over large area. Numerous papers report light emission from polycrystalline oxide LEDs fabricated by various deposition methods. The present efficiency is low, but there is not necessarily a fundamental limitation. When the efficiency can be optimized it will pave the way for large area solid state lighting. The advantages are low-cost and environmentally stable diodes that can be fabricated over a large area with industrially established deposition techniques.

As may be known in the art, the ZnO-based layer may be sandwiched between electrodes of the semiconductor device. Further modification of the ZnO-based layer to provide the semiconductor device may also be included. For instance, optionally one or more electron or hole blocking layers may be applied. This may improve efficiency. One or more electron or hole blocking layers may be arranged at different positions within the stack.

Hence, in an embodiment, the invention provides a light emitting semiconductor device, wherein the semiconductor layer comprises aluminum doped zinc magnesium oxide layer having 1-350 ppm Al. Especially, the semiconductor layer has a nominal composition Zn1-xMgxO with 1-350 ppm Al, wherein x is in the range of $0<x\leq0.3$.

The stack especially comprises a cathode, a semiconductor layer comprising an emissive (oxidic) material, an (oxidic) insulating layer, and an anode (and a support). Optionally, between the support and the cathode or anode, one or more other (functional) layers may be present. Further, optionally between the cathode and the semiconductor layer one or more other functional layers may be present. Especially, between the semiconductor layer and the (oxidic) insulating layer (the barrier layer), and between the barrier layer and the anode, no further other layers are present. However, in addition to (or alternative to) the insulating layer between the semiconductor layer and the anode, one or more further (or other) other blocking layers may be present in the device stack that are not necessarily in contact with the anode (or cathode). However, the one at the anode is especially applied, to help and facilitate hole injection.

The invention also provides the (particulate) luminescent material per se, and thus not only as active (thin) layer in a semiconductor device. Hence, as indicated above, the invention also provides a luminescent material comprising zinc magnesium oxide doped with Al. The zinc magnesium oxide is of the type ZnO; hence, especially (Zn,Mg)O:Al is provided. Hence, the invention also provides a luminescent material comprising zinc magnesium oxide doped with Al having the nominal composition Zn1-xMgxO with 1-350 ppm Al, wherein x is in the range of $0<x\leq0.3$. This may be a particulate or granular material. Preferred ranges with respect to Mg content and Al content are the same as indicated above for the aluminum doped zinc magnesium oxide layer. For instance, the zinc magnesium oxide (luminescent material) may contain 5-40 ppm Al, wherein x is in the range of $0.02<x\leq0.2$.

The fact that the nominal composition "Zn1-xMgxO" is applied does not exclude (small) non-stoichiometric variations, such as in the order of at maximum 5%. Further, this chemical nominal composition does not exclude the presence of other dopants than aluminum (and magnesium). For instance, also sulfur might be present. In an embodiment however, no sulfur is present.

The invention also provides a method for the production of the light emitting semiconductor device as described herein. Hence, in a further aspect the invention provides a method for producing a light emitting semiconductor device, the method comprising providing a support and forming a stack on the support, wherein the stack comprises a cathode, a semiconductor layer comprising an emissive material having an emission in the range of 300-900 nm, an (oxidic) insulating layer, and an anode, wherein the cathode is in electrical contact with the semiconductor layer, wherein the anode is in electrical contact with the insulating layer, and wherein the insulating layer has a thickness in the range of up to 50 nm. Such device may be made with conventional semiconductor production technologies, though formation of the semiconductor layer, i.e. the active layer, may especially be done via pulsed laser deposition (PLD) and radio frequency (RF) sputtering. Hence, in an embodiment the formation of the layer comprises a deposition technique selected from the group consisting of pulsed laser deposition (PLD) and radio frequency (RF) sputtering. Other techniques that may be used as well are e.g. atomic layer deposition (ALD), chemical vapor deposition (CVD) and its variants of CVD method such as metal-organic CVD (MOCVD) or plasma enhanced CVD (PECVD), hydrothermal growth, spray pyrolysis, etc.; in general, any physical and chemical evaporation technique may be applied. Likewise, this may apply for one or more of the other layers in the stack.

In an embodiment, the production comprises forming the cathode on the support, the semiconductor layer on the cathode, the (oxidic) insulating layer on the semiconductor layer, and the anode on the (oxidic) insulating layer, followed by annealing the stack, wherein annealing is performed at a temperature in the range of 400-1100° C. However, inverted building is also possible.

As indicated above, for the conduction band and valence band of the insulating layer especially applies CBb>CBp, especially CBb≥CBp+0.25 and/or VBb≤VBp+1.5 eV, even more especially VBb≤VBp+1 eV. CBb refers to the conduction band of the barrier; CBp refers to the conduction band of the active layer (phosphorescent layer); likewise, VBb refers to the valence band of the barrier and VBp refers to the valence band of the active layer. For instance, the (oxidic) insulating layer is selected from the group consisting of $SiO_2$, MgO, $SrTiO_3$, $ZrO_2$, $HfO_2$, and $Y_2O_3$. Suitable emissive materials are also defined above.

In a specific embodiment, the semiconductor layer (thus formed) has the nominal composition $Zn_{1-x}Mg_xO$ with 1-350 ppm Al, wherein x is in the range of $0<x\leq0.3$. In a further embodiment, the method comprises (a) providing a composition comprising Zn, Mg and Al having the nominal composition $Zn_{1-x}Mg_xO$ with 1-350 ppm Al, wherein x is in the range of $0<x\leq0.3$, optionally heat treating this composition at elevated temperatures, and (b) subsequently annealing the optionally heat treated composition to provide said aluminum doped zinc magnesium oxide.

As indicated above, the invention also provides a method for the production of an aluminum doped zinc magnesium oxide, such as described above. Hence, in a further aspect, the invention provides a method for the production of an aluminum doped zinc magnesium oxide, the method comprising (a) providing a composition comprising Zn, Mg and Al with having the nominal composition $Zn_{1-x}Mg_xO$ with 1-350 ppm Al, wherein x is in the range of $0<x\leq0.3$, optionally heat treating this composition at elevated temperatures, and (b) subsequently annealing the optionally heat treated composition to provide said aluminum doped zinc magnesium oxide.

Even more especially, the invention provides a method for the production of an aluminum doped zinc magnesium oxide having the nominal composition $Zn_{1-x}Mg_xO$ with 1-350 ppm Al, wherein x is in the range of $0<x\leq0.3$. This may include a method to generate a (particulate) luminescent material, but this may also include a method to produce a thin layer on a substrate. Especially, the method comprises heat treating (especially under oxidative conditions) a composition comprising Zn, Mg and Al with a predetermined nominal composition at elevated temperatures, and subsequently annealing the heat treated composition to provide said aluminum doped zinc magnesium oxide. The phrase "a composition comprising Zn, Mg and Al" may especially refer to one or more compounds comprising Zn, Mg and/or Al, respectively. These may also be indicated as precursor (s), see below.

The term composition may in an embodiment relate to a combination of one or more precursors of the luminescent material, such as metal oxides, or metal salts, like nitrates, sulfates, chlorides, fluorides, bromides, hydroxides, carboxylates such as oxalates, etc. etc. Optionally also a sulfide (or even optionally a selenide and/or a telluride), such as zinc sulfide might be applied as precursor. Especially, one or more of a metal oxide, a nitrate, a chloride, a hydroxide, and a carboxylate (such as an oxalate) are applied. Combinations of two or more of such precursor types may also be applied. Due to the heat treatment, the aluminum doped zinc magnesium oxide may be formed, but especially the material may be formed during annealing. The heat treatment and annealing may in an embodiment be performed until at least a poly crystalline material is formed.

In another embodiment, the composition may be formed on a substrate. This may be done at elevated temperatures. For instance, the substrate may be heated. Hence, in a specific embodiment of the method, the method comprises forming an aluminum doped zinc magnesium oxide based layer having the nominal composition $Zn_{1-x}Mg_xO$ with 1-350 ppm Al, wherein x is in the range of $0<x\leq0.3$, the method comprising forming a layer comprising the composition comprising Zn, Mg and Al with the predetermined nominal composition on a substrate at elevated temperatures, and annealing the thus formed layer to provide the aluminum doped zinc magnesium oxide based layer. For such an embodiment, the formation of the layer comprises a deposition technique selected from the group consisting of pulsed laser deposition (PLD) and radio frequency (RF) sputtering. However, also other deposition techniques may be applied (see also above).

As target material, the oxides may be applied, or mixed oxides may be applied. Especially, as target material (crystalline) aluminum doped zinc magnesium oxide is applied. Hence, the method may especially comprise depositing of the layer of said zinc magnesium oxide on the substrate by pulsed laser deposition or RF sputtering of an aluminum doped zinc magnesium oxide having the nominal composition $Zn_{1-x}Mg_xO$ with 1-350 ppm Al (i.e. here target material), wherein x is in the range of $0<x\leq0.3$ (nominal composition). With pulsed laser deposition (PLD) and radio frequency (RF) sputtering, a layer may be deposited on the substrate, having the desired composition. In this way, a II-VI semiconductor layer for a semiconductor device may be produced.

The term "the predetermined nominal composition" especially relates to the fact that starting components or a composition are composed in such a way, that the ratio of the elements may lead to the desired composition of the end product, i.e. aluminum doped zinc magnesium oxide having the nominal composition $Zn_{1-x}Mg_xO$ with 1-350 ppm Al, wherein x is in the range of $0<x\leq0.3$. As indicated above, the values that can be derived from the formula "$Zn_{1-x}Mg_xO$ with 1-350 ppm Al" refers to the nominal composition that is weighed out, and which forms the zinc magnesium oxide. The formed material may in addition to the zinc magnesium oxide, also optionally comprise (remaining) MgO.

With respect to deposition (of the semiconductor layer; i.e. the active layer), the deposition is especially performed during a deposition time, wherein during at least part of the deposition time the substrate is maintained at a temperature of at least 450 C.° for RF sputtering or at least 500° C. for pulsed laser deposition. With the indicated techniques, layers may be grown at a rate of about 0.3-1 nm/s, such as 04-0.8 nm/s, like about 0.6 nm/s.

The (first) heat treatment is especially at a temperature of at least 450° C., although for the synthesis of the luminescent material, even a temperature of at least 900° C., such as at least 1100° C. may be chosen. For instance, in the case of the heat treatment to provide the luminescent material, the temperature may be in the range of 1000-1800° C. Thereafter, the material may be cooled down, ground (in case of a particulate material), and be subject to the annealing. In case of making the semiconductor layer, the (first) heat treatment will in general be at least 450° C., but not higher than 800° C. However, in yet another embodiment, deposition is done at a substrate at a lower temperature than 450° C. Optionally, the substrate may even be at room temperature. Especially, however, the substrate is at elevated temperatures, such as indicated above.

It appears that annealing in a reducing atmosphere does not give entirely desired results. Especially, annealing is performed in a neutral or oxidizing atmosphere. Especially, the method includes annealing in an oxidizing atmosphere. Further, the method may especially comprise annealing at a temperature of at least 900° C. for at least 30 min. For instance, the temperature may be in the range of 900-1800° C. Note that heat treatment and annealing are two different actions, which are in general separated by one or more other steps, such as including a cooling step. For the synthesis of a layer, the temperature maximum for the (first) heat treatment and the annealing may be limited to the temperature stability of the substrate and/or the reactivity of the substrate. In general, the temperature should not be higher than 1200° C., such as not higher than 1100° C. For powder synthesis, the annealing temperature may be above 1000° C., such as at least 1200° C.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation. Hence, the phrase "II-VI based light emitting semiconductor device" is also directed to a device which is switched off, and which will in the switched off state not be light emitting. The semiconductor layer comprising an emissive material may especially comprise an n-type emissive material. Hence, the semiconductor layer may be an n-type semiconductor layer, such as n-ZnO or n-CdS, etc.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7a has on the left axis the absolute irradiance in photons/cm2.nm)

FIG. 10a (top) I-V characteristics of ITO/ZAM/MgO/Au diode; in FIG. 10b, the curve with two peaks is the 10V/50 mA electroluminescent spectrum; the other curve is the PL spectrum (see e.g. FIG. 8);

DETAILED DESCRIPTION OF THE EMBODIMENTS

Figure 1:
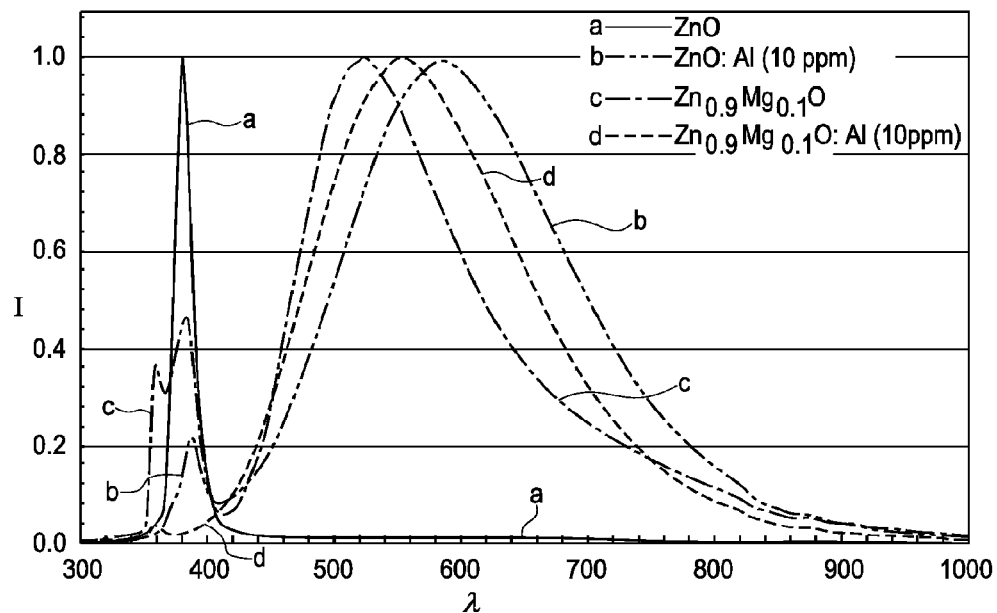
FIG. 1 depicts emission spectra of a number of luminescent materials; Normalized emission spectra of ZnO (a), ZnO:Al (10 ppm) (b), Zn0.9Mg0.1O (c), and Zn0.9Mg0.1O: Al (10 ppm) (d). All measured as powders sandwiched between quartz plates, excitation at 325 nm.

For the compositions $Zn(1-x)Mg_xO$ desired quantities of zinc oxide (5N purity, Aldrich) and magnesium oxide (FO Optipur, Merck) were weighed into a 100 ml beaker and mixed for 4 minutes at 1800 rpm using a speed mixer (Hauschild, type DAC 150 FVZ-K). The compositions were put into an aluminum oxide crucible and fired inside a chamber furnace in air for 8 hours at 1100° C. using a heating and cooling rate of 200° C./hour. After cooling down the powders were grinded using an agate mortar and pestle and fired once again at 1100° C.

For aluminum doped $Zn(1-x)Mg_xO$ first a desired amount of aluminum nitrate nonahydrate (p.a., Merck) was dissolved in a small amount of deionized water and diluted with 200 ml ethanol. Next desired amounts of zinc oxide (5N purity, Aldrich) and magnesium oxide (FO Optipur, Merck) were added and the obtained suspension was dried using a rotary evaporator. The compositions were put into an aluminum oxide crucible and fired inside a chamber furnace in air for 8 hours at 1100° C. using a heating and cooling rate of 200° C./hour. After cooling down the powders were grinded using an agate mortar and pestle and fired once again at 1100° C. From the $Zn0.9Mg0.O+10$ ppm Al powder, targets suitable for sputtering and pulsed laser deposition (PLD) were prepared.

A number of 400 nm thin films were grown on epi-polished a-cut sapphire substrates by PLD and RF magnetron sputtering. The base pressure of the PLD system was $2\times10-7$ mbar. During the deposition the substrate temperature was between 25° C. and 550° C. and the partial oxygen pressure was 0.2 mbar. The RF magnetron sputtering system had a base pressure of $6\times10-7$ mbar and the used substrate conditions were either 25° C., 450° C. or 550° C. The gas flows during the sputtering process were resp. 78 and 2 sccm for Ar and O2, the total pressure was 0.038 mbar, RF power was 60 W.

The thin film composition was analyzed using x-ray fluorescence (XRF) and secondary ion mass spectrometry (SIMS). For optical analysis of the powders, they were sandwiched between Asahi quartz substrates (that were found to be non-luminescent with at the excitation wavelengths used) and the sides were sealed with a UV-transparent epoxy glue (Epo-Tek 305). UV/Vis spectra were measured on a Perkin Elmer Lambda-950 spectrometer, emission and excitation spectra on an Edinburgh FLS920 fluorescence spectrometer. Photoluminescence (PL) emission spectra were measured on a home-built setup consisting of a Ocean Optics QE65000 spectrometer operating at −20° C., with either a 25 mW 325 nm CW He—Cd laser or a Spectraphysics Explorer 349 nm Nd:YLF pulsed laser as excitation sources. The latter laser was operated at 2.5 kHz repetition rate with a pulse length of ~5 ns. The power incident on the sample was tuned with a VBA-200 beam splitter from Jodon Laser combined with a set of neutral density filters. Emission was detected at 90° angle to the incident laser beam by collection with a collimating lens, passed through a long-pass filter to remove residual laser light and then focused into an optical fiber connected to the spectrometer. The sample was oriented at a 120° angle with respect to the incident beam to prevent the specular reflection of the laser beam from entering the collimating lens. Absolute external quantum efficiencies were determined using a 6" integrating sphere from Labsphere (model RTC-060-SF) which was equipped with a center mount. The laser only spectrum was taken with the center mount rotated parallel to the beam, so that the beam did not touch the sample mount directly. For the sample measurement, the beam hit the sample at 10° C. rotated with respect to the normal of the sample surface, so that the specular reflection of the laser beam was kept inside the sphere. Spectrometer, optical fibers and integrating sphere were all calibrated with a LS-1-CAL calibration lamp from Ocean Optics, to enable absolute irradiance measurements. Cathodoluminescence (CL) was measured on a modified SEM. All optical characterizations were conducted at room temperature.

Normalized PL emission spectra of ZnO+10% Mg (curve c), ZnO:Al (10 ppm) (curve b) and $Zn0.9Mg0.1+10$ ppm Al (curve d) are shown in FIG. 1. The PL from pure ZnO (curve a) is the typical near-band gap emission (NBE) at ~385 nm, with a very shallow, broad emission in the visible that is generally attributed to (oxygen related) defects. For all the other samples the situation is reversed and the primary PL signal is a broad emission in the visible, centered around 500-600 nm, again attributed to defect emission. This visible emission is specifically not originating from direct luminescence of the dopants themselves. Some minor NBE signal is visible in the UV. It is especially noteworthy that the addition of only a small amount of Al (10 ppm) (curve b) changes the PL output completely from almost entirely NBE-emission to almost entirely defect emission, with the peak maxima remaining virtually unchanged from the host ZnO.

Some differences in the wavelength of maximum visible emission between the different powders are observed: 520 and 585 nm for $Zn0.9Mg0.1O$ (curve c) and ZnO:Al (curve b), respectively, with the sample according to the invention being in the middle at 555 nm (curve d).

Figure 2:
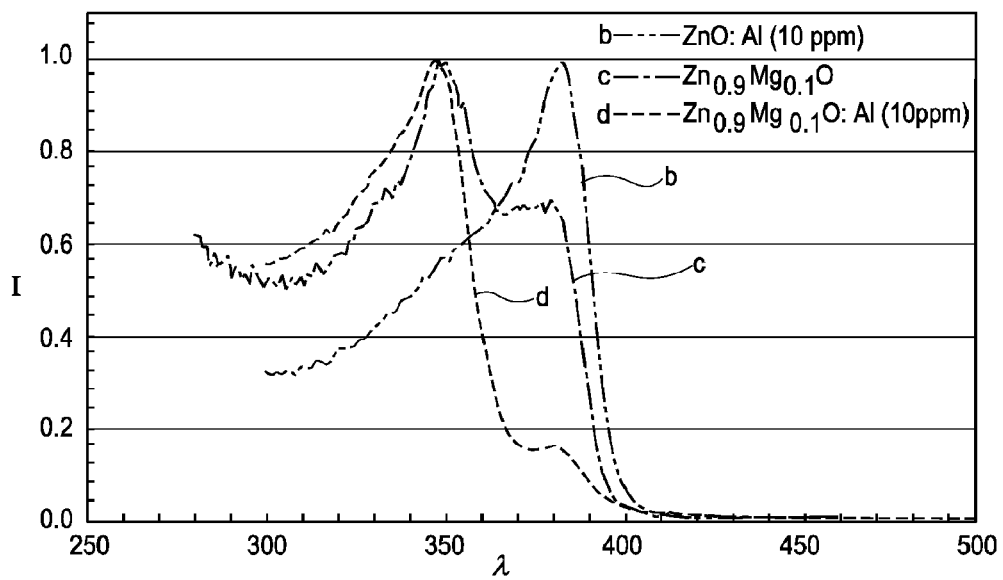
FIG. 2 depicts excitation spectra of a number of luminescent materials; Normalized excitation spectra of ZnO:Al (10 ppm) (b), Zn0.9Mg0.1O (c), and Zn0.9Mg0.1O: Al (10 ppm) (d)

The excitation spectra of ZnO+10% MgO (curve c), ZnO:Al (10 ppm) (curve b) and $Zn0.9Mg0.1+10$ ppm Al (curve d) as measured with an Edinburgh fluorescence spectrometer are shown in FIG. 2. The excitation spectrum of ZnO could not be measured due to the very low emission. It can be seen that the optimal excitation wavelength is about 385 nm for the non-Mg containing powder which coincides with the NBE emission of ZnO. The Mg containing samples have their optimal excitation wavelength at 350 nm, but in both cases a secondary peak is observed at 385 nm, which is especially high in the ZnO/Mg case. This secondary maximum is again indicative that the ZnO and MgO have not fully mixed.

Table I shows the results from absolute (external) quantum efficiency (EQE) measurements on ZnO powders with various amounts of Mg and/or Al, measured at 349 nm excitation. Absorption at this wavelength is typically about 85% of the incident light. The power of the laser was tuned so as to be in a regime where the emission varied linearly with the intensity. It is immediately clear that having none or only one of Mg and Al present in the powder results in only limited quantum efficiency. When both are present, a large increase in EQE is observed.

TABLE I

External quantum efficiencies (%) of $Zn(1 - x)Mg_xO:Al$ powders as a function of composition. Excitation with 349 nm laser.

| | % Mg | | | | | | |
|---|---|---|---|---|---|---|---|
| ppm Al | 0 | 1 | 5 | 7.5 | 10 | 15 | 20 |
| 0 | 0.8 | 2.1 | 3.0 | | 2.5 | | |
| 10 | 2.5 | | | 5.6 | 13.7[a] | | 8.7 |
| 20 | | | | | 14.7 | | |
| 40 | | | | | 15.3 | 23.7 | |
| 70 | | | | | 10.6 | | |
| 100 | 2.0 | | | | 9.4 | | |
| 1000 | 1.1 | | | | 8.0 | | |

[a] an earlier batch of powder, that was used to prepare the target for PLD and sputtering, was found to have an EQE of 9.8%.

The dependence on the Al content is intriguing. Only a tiny amount (~10 ppm) is needed to increase the EQE of the ZnO/Mg powder, and adding (much) more has no substantial effect or may lead to other undesired properties, like a too large electric conductivity. Hence, an amount of at maximum 200 ppm, especially at maximum 100 ppm seems beneficial.

Normally for a phosphor at low activator content, the PL output increases linearly with doping content as the emission competes with non-radiative processes in the host lattice. This linearity generally remains until concentration quenching sets in, typically above a few percent dopant, as at such higher concentrations the dopant centers start to interact by processes like Auger recombination. The dependence on Mg content is also found to be non-linear.

From the Zn0.9Mg0.1O+10 ppm Al 400 nm thin layers were deposited on sapphire substrates by PLD and RF sputtering. Analysis of the sputtered layers by XRF and SIMS showed the Mg and Al content to be 9.6% and 14 ppm respectively, so the concentration of both dopants is more or less preserved during the deposition process. X-ray analysis showed both deposition techniques to afford essentially epitaxial layers.

While the layers were deposited at elevated substrate temperatures (500° C. for PLD, 450° C. for sputtering), the PL of the as deposited layers was low. It was found that annealing of the samples was required to achieve maximum luminescence, as is shown for both types of deposition. The minimum temperature for maximum PL appears to be 900° C. for both samples, although there is a marked difference in the evolution of the PL as a function of anneal temperature for the two deposition techniques.

Figure 3A:
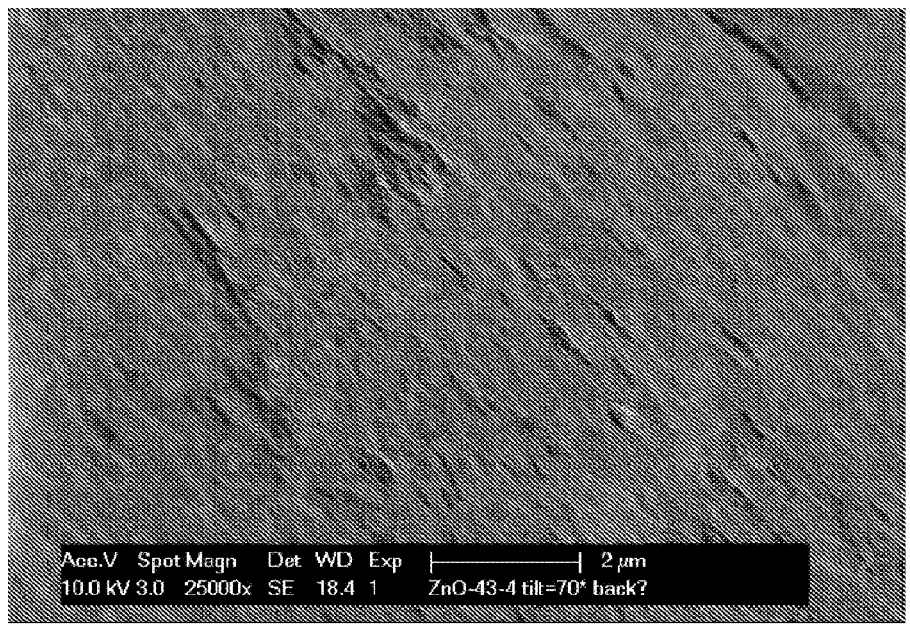
FIG. 3a-3b depict SEM graphs from a sputtered aluminum doped zinc magnesium oxide layer before (a) and after (b) annealing at 1100° C.
Figure 3B:
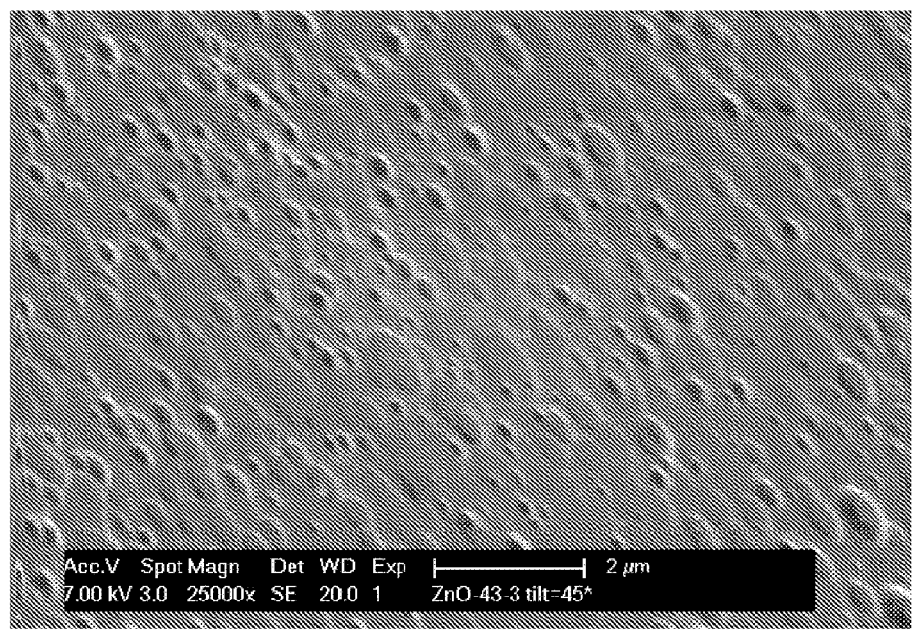

For the PLD sample, at 700° C. there appears to be an intermediate stage where 2 peaks are visible in the PL spectrum. After anneal at 900° C., the spectrum is more or less identical to that of the parent powder. Above 900° a slight apparent increase in PL output could still be observed. The sample itself however exhibited formation of a haze in the formerly transparent sample according to the invention layer. SEM showed this haze to be due to the presence of slightly larger 'crystallites' that have grown at elevated temperatures. Cracks were not observed. This haze affect is likely to lead to a more efficient outcoupling of the light normal to the plane of the sample according to the invention layer (where the PL emission is measured). The sputtered layers were found to remain clear upon annealing up to 1100° C. SEM pictures from a sputtered aluminum doped zinc magnesium oxide layer before (a) and after (b) annealing at 1100° C. are shown in FIG. 3 (a and b, respectively).

In order to answer the question if annealing at higher than 900° really results in higher output or if the hazing effect clouds the issue, for both types of deposition techniques the absolute EQE as a function of anneal temperature was also determined. The results are listed in Table II, and indeed the EQE at 1000° C. anneal is slightly lower than at 900° C. (although the values are close to the detection limit). A similar anneal experiment was performed for Zn0.85Mg0.15O+40 ppm Al where a similar trend was observed, as well as higher EQE values. The optimum temperature was found to be 950° C., in line with the data for Zn0.9Mg0.1O+10 ppm Al.

Table II reflects systems wherein the layers have the nominal composition Zn0.9Mg0.1O:Al (10 ppm) and Zn0.85Mg0.15O:Al (40 ppm).

TABLE II

Absolute EQE (at 349 nm excitation) for samples according to the invention layer deposited on sapphire, versus anneal temperature. Anneal performed in air for 30 minutes.

| Anneal Temperature (° C.) | Absolute QE (%) $Zn_{0.9}Mg_{0.10}$: Al (10 ppm) (PLD) | Absolute QE (%) $Zn_{0.85}Mg_{0.15}$O: Al (40 ppm Al) (sputter) |
|---|---|---|
| 500 (as deposited) | 0.26 | |
| 700 | 0.55 | |
| 900 | 1.10 | 1.64 |
| 950 | | 7.23 |
| 1000 | 0.97 | 6.13 |
| 1050 | | 4.32 |
| 1100 | | 0.9 |
| 1150 | | 0.46 |

In the case of the sputtered layer, two things become apparent. Firstly, the wavelength of maximum emission is red shifted some 50 nm with respect to the parent powder emission. Secondly, upon annealing at increased temperatures, a second peak starts to appear at 480 nm. Upon further annealing, the 480 nm peak starts to disappear again and a slight blue shift of the main peak is observed. At the highest anneal temperature (1100° C.) the 480 nm peak is completely gone and the main peak has shifted to 550 nm. The resulting PL spectrum is completely identical to a powder sample according to the invention. It appears that sputtering results in different phases in the layer, and annealing at 1100° C. is gives best results.

Apart from the temperature, the effect of the annealing atmosphere was also checked. Identical samples of sample according to the invention on sapphire, deposited by deposition, were annealed in different atmospheres (neutral, reducing and oxidizing) for 1 hour at 650° C. Note that this lower temperature was dictated by the requirements of one of the electrode materials (ZnO+2% Al). The PL output was measured using the qualitative part of the setup as the EQE's were generally below the detection limit of the quantitative setup. As the outcoupling characteristics of the samples were similar, this still affords a good comparison of the emission. For most atmospheres, the maximum emission was observed at 610 nm. In several samples a shallow shoulder was observed at 790 nm that was especially visible in the vacuum annealed sample. The relative results of the PL output are listed in Table III, with the sample annealed for 1 hour in air set at 100%. The conductivities of the layers were also determined.

TABLE III relative PL output and conductivity of PLD samples according to the invention-10 layers on sapphire, as a function of the anneal atmosphere. Anneal done for 1 hour (unless stated otherwise) at 650° C. and atmospheric pressure.

| Anneal atmosphere | Relative photon flux (%) | Sheet resistance (MΩ/square) |
| --- | --- | --- |
| As deposited (500° C.) | 0.6 | 1E+5 |
| Air (1 hour) | 100.0 | <1E+4 |
| Air (64 hour) | 96.8 | 3E+4 |
| Argon | 97.5 | 4E+1 |
| Oxygen | 64.1 | 3E+4 |
| 5% hydrogen in argon | 1.1 | 8E+4 |
| vacuum | 42.3 | 1E+1 |
| $NH_3$ | 6.7 | 1E+4 |
| Nitrogen (dry) | 83.8 | 1E+1 |

From Table III it is clear that ambient air affords the best performing samples for PL output. Upon annealing for prolonged periods of time in air, a slight decrease in performance is observed as well as a small redshift of the emission to about 630 nm. The 'neutral' atmospheres argon and nitrogen provided results similar to air. Vacuum and pure oxygen, had roughly half the output of the air sample, presumably by both influencing the (number of) oxygen vacancies in a non-ideal way. The reducing atmospheres (H2/Ar and NH3) had severely diminished output, presumably by removal of oxygen from the sample according to the invention layer.

The sheet resistance of the layers was generally high (10-100 GΩ/square) for all atmospheres barring the 'neutral', non-oxygen containing ones (vacuum, argon, nitrogen) where it was 3 orders lower.

Hence, a new type of zinc oxide based phosphors has been prepared by incorporating both MgO (e.g. up to 15%) and a trace (e.g. 10-40 ppm) of Al as dopants. These phosphor powders showed visible emission and an order of magnitude increase in quantum efficiency compared to ZnO with no or only one of Mg and Al present. The phosphors proved robust to thin layer deposition techniques such as PLD and RF sputtering. Annealing in air at elevated temperatures (up to 900-1100° C. depending on the deposition technique) was found to be very beneficial for integration of all the substituent materials in the thin layers and increase the photoluminescence. The enhanced emission in both powder and thin layer could not be attributed to direct emission of the additives, but is thought to stem from radiating defects in the ZnO lattice, most likely oxygen-related. Only band edge excitation was observed, which was further corroborated by CL, showing that these phosphors operate through energy absorption by the host material, followed by energy transfer to the radiant defect and subsequent emission, making these materials potential candidates for the emissive layer in large area LEDs.

Herein, we further present a generic solution toward achieving light-emission from devices that are made of thin-films of ZnMgO:Al phosphor sandwiched between two/ or more layers. Functional ZnO LEDs are demonstrated, with EL spectra that match that of the ZnO phosphor.

For detailed preparation of emissive material, we refer to the above. Here a short explanation of the phosphor preparation is given. For aluminium doped Zn(1-x)MgxO first a desired amount of aluminium nitrate nonahydrate (p.a., Merck) was dissolved in a small amount of deionised water and diluted with 200 ml ethanol. Next desired amounts of zinc oxide (5N purity, Aldrich) and magnesium oxide (FO Optipur, Merck) were added and the obtained suspension was dried using a rotary evaporator. The compositions were put into an aluminium oxide crucible and fired inside a chamber furnace in air for 8 hours at 1100° C. using a heating and cooling rate of 200° C./hour. After cooling down the powders were grinded. After firing once again at 1100° C., targets suitable for sputtering and pulsed laser deposition (PLD) were prepared.

Thin films of ZnO phosphor were RF magnetron sputtered on a variety of substrates. Thin films of other metal oxides were either sputtered of physical vapor deposition. First 400 nm thin films of ZnO phosphor was grown on ITO coated epi-polished a-cut or c-cut sapphire substrates by PLD or RF magnetron sputtering. The base pressure of the PLD system was 2×10-7 mbar. During the deposition the substrate temperature was between 25° C. and 550° C. and the partial oxygen pressure was 0.2 mbar. The RF magnetron sputtering system had a base pressure of 6×10-7 mbar and the used substrate conditions were either 25° C., 450° C. or 550° C. The gas flows during the sputtering process were resp. 78 and 2 sccm for Ar and O2, respectively. The total pressure was 0.038 mbar, and the RF power was 60 W, and the bias voltage was around 250V. Next a layer of metal-oxide was deposited on to the phosphor layer and then metal contacts were deposited. Devices were annealed and then measured.

Photoluminescence (PL) emission spectra were measured as defined above.

Electrical measurements were conducted in a dark chamber at ambient. Light emission from the devices was recorded using a photo-diode. Current-voltage characteristics of the diodes were recorded using HP semiconductor analyzer. To record the EL spectrum of the LED, the Ocean Optics QE65000 spectrometer operating at −20° C. was used. The emitted light from the LED was fed into an optical fiber that was mounted on top of the emissive area and connected to the spectrometer.

Sputtered Thin Layers

The RF magnetron sputtering was used to sputter thin films of different variation of Zn0.90Mg0.10O (ZAM-10) and Zn0.85Mg0.15O. The phosphors used here were doped with Al in range of 0 to 100 ppm. The range of Al doping can be higher. The substrate temperature could be controlled during the deposition. Many phosphor compositions were made, measured and used in devices. Thin-film deposition conditions were varied, e.g. substrate temperature, from RT, to ~500° C. Here we only present the results on the Zn0.85Mg0.15O doped with 40 ppm Al (ZAM-40) deposited at RT.

Thin film sputtering was conducted at a base pressure of 6×10-7 mbar. The substrate temperature during deposition was kept at room temperature. The RT substrate temperature was justified by our investigation that showed samples having different substrate deposition temperature have similar PL after annealing at T>550° C. Hence the choice of low substrate temperature is justified.

Sputtered films were prepared on Sapphire and ITO-coated Sapphire substrates. After deposition each substrate was subjected to annealing at one particular temperature. Thus no thermal histories were present for the samples. The annealing temperature was varied between RT up to 1150° C. for 30 min in ambient. After annealing samples were cooled down relatively slowly for 10-15 min in ambient air. Subsequently PL and EQE were measured. Later XRD and AFM were performed.

Figure 4A:
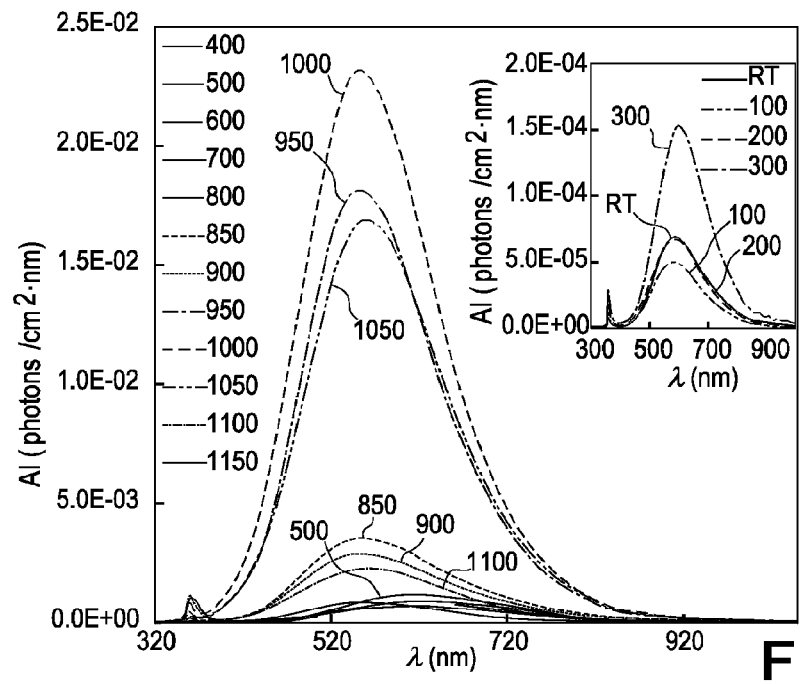
FIGS. 4a and 4b show PL (photoluminescence) spectra of sputtered Zn0.85Mg0.15O doped with 40 ppm Al (ZAM-40) deposited on sapphire (4a) and ITO-coated sapphire (4b). Films were deposited at room temperature, and were subsequently post annealed; a plurality of annealing temperatures were investigated; some temperatures are indicated to better understand the temperature trends.
Figure 4B:
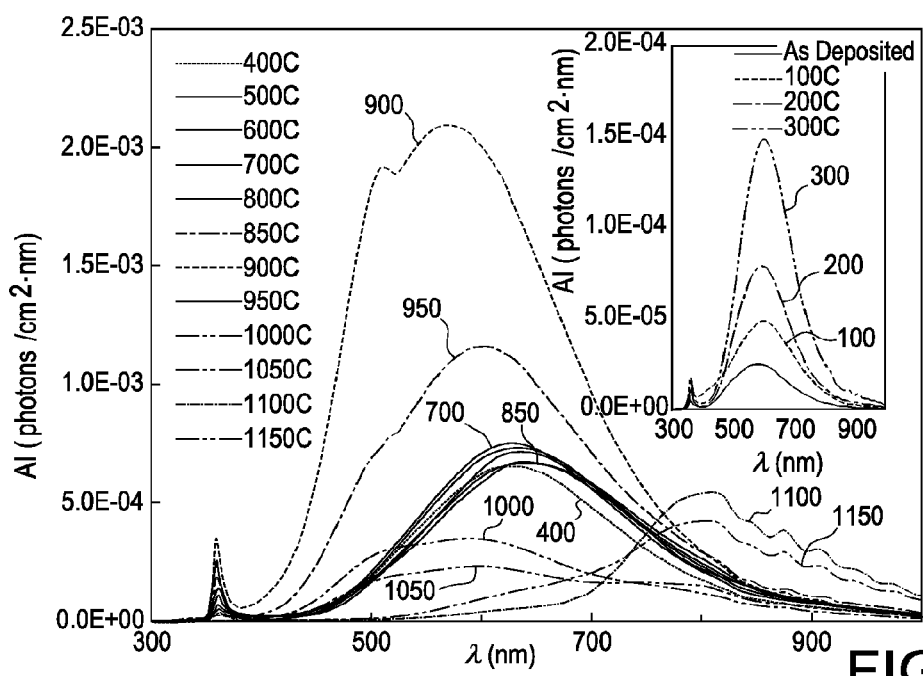

Primary results of the PL measurements are given in FIG. 4a-4b, where PL is measured as a function of post-annealing for RT sputtered thin film of Zn0.85Mg0.15O doped with 40 ppm Al, on the sapphire and ITO-coated sapphire substrates. Deposition of the phosphor layer at room temperature results in low PL emission as shown in the insets of FIG. 4a-4b. It is clear that post-annealing of the films have a profound influence on the PL spectra, as the emission enhances with increasing annealing temperature. However there is an optimum for the anneal temperature. It seems that there is an optimum annealing temperature is between 900-1000° C., where the PL response maximizes.

Figure 5:
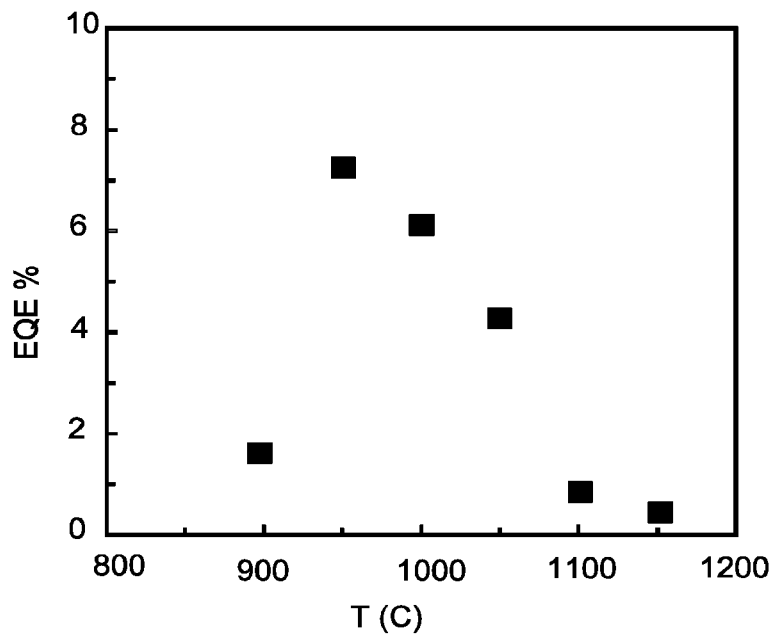
FIG. 5 depicts photoluminescence EQE (external quantum efficiency) measurements as function of post deposition anneal temperature for ZAM-40 deposited on sapphire.

The optimum of post-anneal temperature for ZAM/sapphire was determined by EQE measurement of the different samples. The results of the EQE measurements as function of temperature, is given in FIG. 5. It seems that the best annealing temperature for ZAM-40/sapphire is 950° C., where EQE exceeds 7.2%. EQE of the sputtered thin-film of ZAM-40 is almost a factor of 2 larger than that of the epitaxially grown GaN (4%).

In fabrication of the LED however the ZAM layer is deposited on to another layer of either metal or metal-oxide which acts as the electrode for charge injection into the device. Therefore PL response of the ZAM layer could be different. To this point ZAM-40 was deposited onto ITO-coated sapphire. PL spectra is given in FIG. 4a. The only effect of the ITO seems to be red-shifting the defect emission peak of the ZAM-40 from 550 nm to >600 nm. The initial red-shift gradually decreases toward the original defect emission of ZAM-40 (FIG. 4a) as the annealing temperature rises. At 900° C. however the shift of the defect emission peak toward lower wavelengths stops and PL abruptly changes. This abrupt change in the PL spectra has to do with the fact that ZAM-40 at temperatures higher than 900° C. start to form alloy with ITO hence changes the PL spectra. It is however of interest to see whether presence of ITO hampers the light emission from the ZAM-40 layer. To do so, we calculated photon flux emitted from ZAM-40 deposited on both sapphire and ITO-coated sapphire and compared both.

Figure 6:
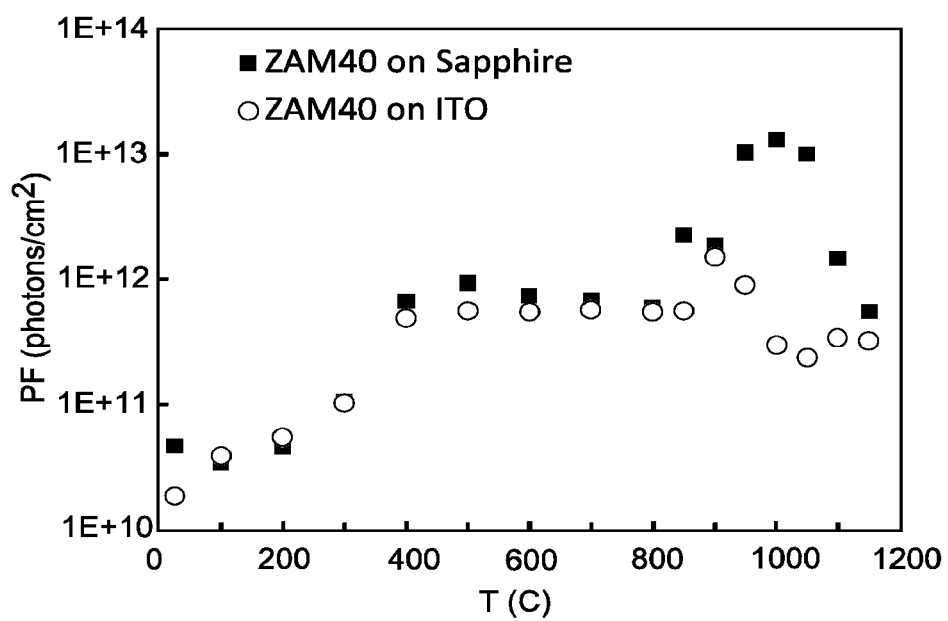
FIG. 6 shows a comparison of the PL spectra of ZAM-40/sapphire and ZAM-40/ITO/sapphire versus post-deposition anneals temperature.

In FIG. 6 a comparison has been made for the photon flux (PF) of the ZAM on sapphire, and ITO/sapphire. Presence of the ITO does not compromise on the optical performance of the ZAM layer up to 800° C. At the same time this figure shows that annealing temperatures in the range of 400° C. to 800° C. have a very negligible influence on the PL emission of the ZAM. At 400° C. the phosphor is already activated. The lower performance of the ZAM/ITO/sapphire in compare to ZAM/sapphire, at temperatures higher than 800° C. is due to the degradation of the ITO and possibly formation of ZAM:ITO alloy. For ZAM/sapphire substrates, there is a rise in photon flux with a maximum at around 950° C.-1000° C., indicating the optimum annealing temperature. Surprisingly, light emission from both samples is the same and the best of phosphor activation is reached when ZAM is annealed up to 950° C.-1000° C. ITO however cannot withstand these high temperatures. Application of metals or conducting metal-oxide which can stand high annealing temperature would be advantageous in this respect, as it allows full activation of phosphor in real devices.

PL Spectra of ITO/ZAM/Insulating-Oxide Stack

Figures 7A, 7B:
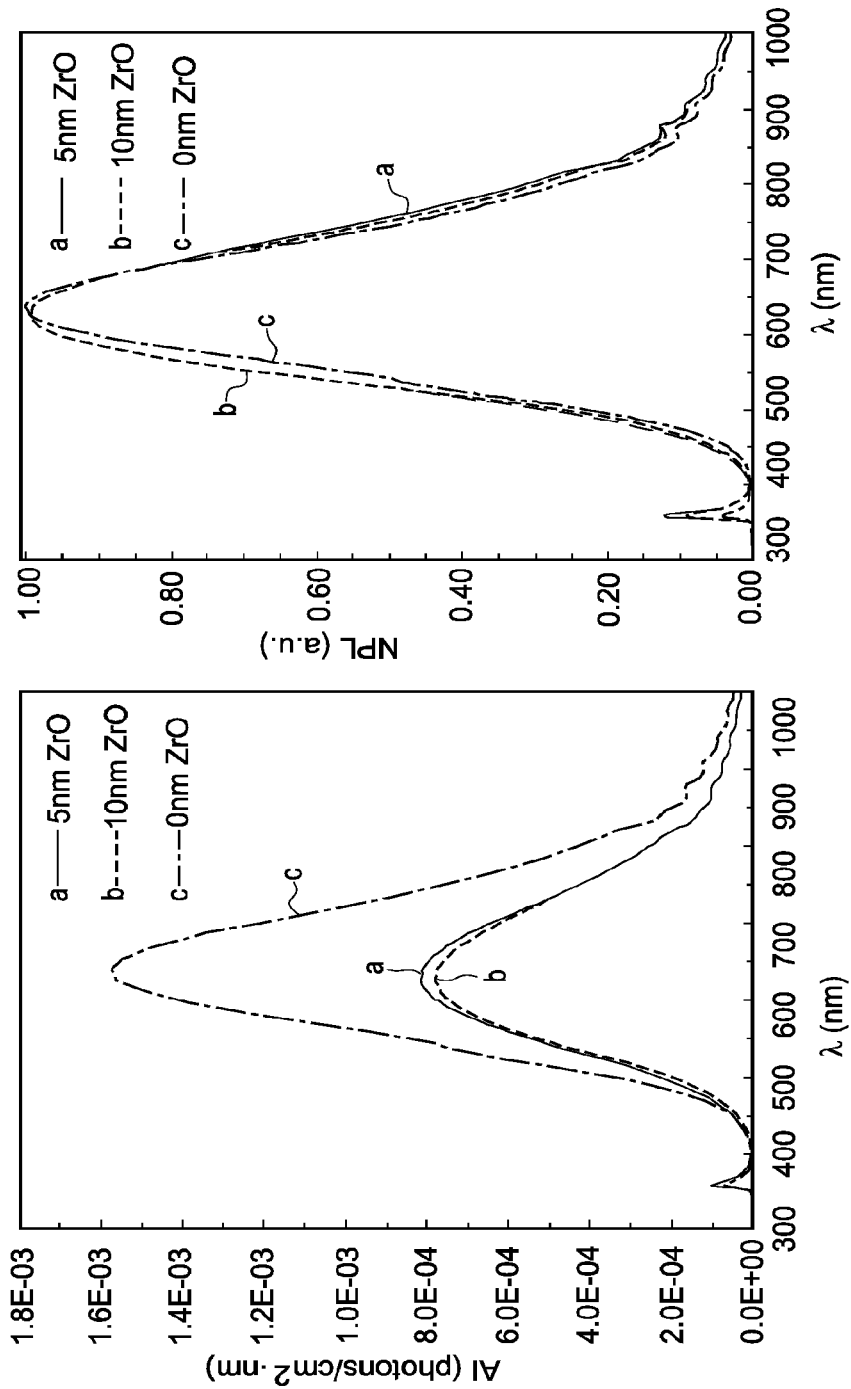
FIGS. 7a (left) and 7b (right) show PL spectra of ZAM layer on ITO coated sapphire capped with ZrO layer of different thicknesses.
FIG. 7b has on the y-axis the normalize photoluminescence (in arbitrary units); both have a wavelength scale (in nm) as x-axis.

The first question to be addressed here is whether deposition of an extra oxide layer would change the emission spectra of the ZAM layer. To do so, we sputtered ZAM onto the ITO-coated substrate. As a test model, we deposited 5 nm and 10 nm of ZrO onto the ZAM layer. The substrates were annealed at 600° C. for 30 min and slowly cooled down. The respective PL spectra of the samples are shown in FIG. 7a-7b. Clearly insertion of the ZrO layer does not change the PL spectra. The intensity however seemingly drops slightly in the presence of ZrO layer. Excluding all the experimental and instrumental errors, one possible reason will be less light out-coupling when an extra ZrO oxide layer is incorporated onto the stack.

Figure 8:
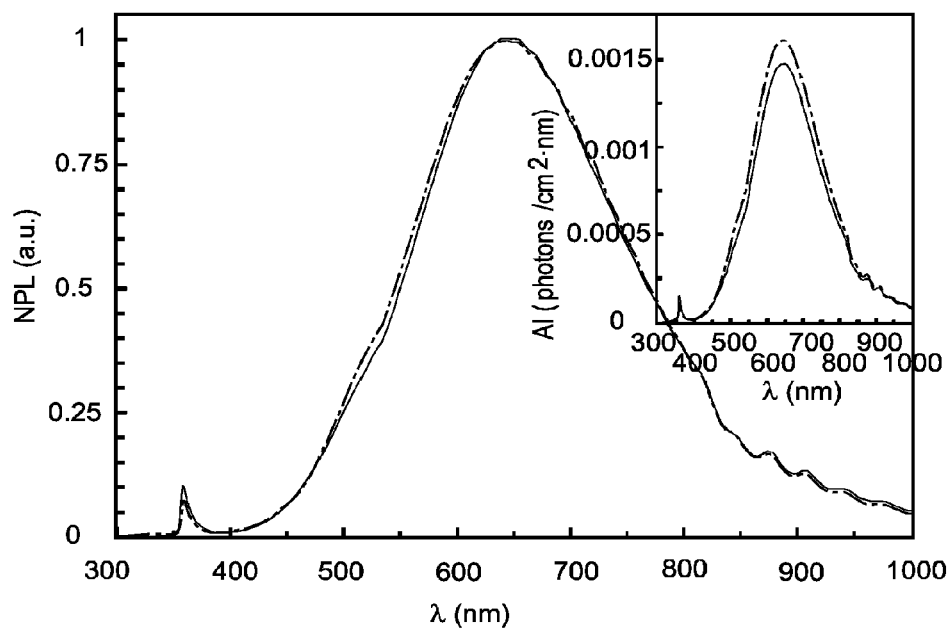
FIG. 8 shows normalized PL spectra (in arbitrary units on the y-axis) of sapphire/ITO/ZAM layer (dot-dashed) capped with MgO (line) as function of the wavelength (in nm)

To further investigate whether the top insulating layer influences the PL of the ZAM layer, we deposited MgO layer onto the ZAM layer and subsequently annealed the stack at 800° C. FIG. 8 shows the PL spectra of the ZAM layer capped with MgO layer in comparison with a bare ZAM. Clearly there is no influence of the insulating MgO layer on the PL of the phosphor even after annealing at 800. Incorporation of an insulating layer into the diode stack therefore has no influence on the PL spectra of the emissive ZAM layer. In fabrication of the diodes we therefore tried different insulating metal oxides such as, MgO, MoOx, V2O5, NiOx and ZrO. Experiments with $SiO_2$ (SiOx) and other oxides were also conducted, and similar results were obtained.

Fabrication of ZnO LEDs

Figure 9A:
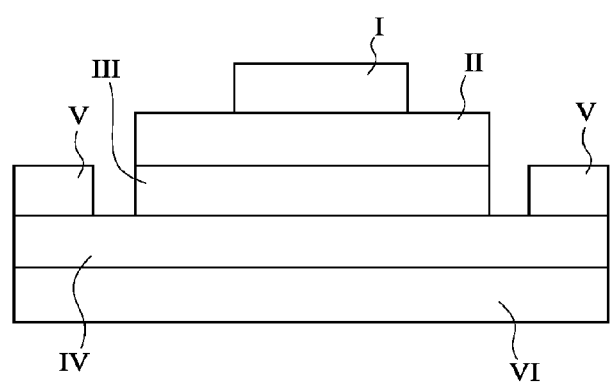
FIGS. 9a (left), 9b (right) schematically show an embodiment of the device layout of a (ZnO) diode; References I-VI respectively refer to the anode (I), such as Au and/or Pt, the barrier layer (II), such as a metal oxide, having a layer width of larger than 0 nm and e.g. equal or smaller than 30 nm, the active layer (III), such as (Zn.Mg)O:Al, the cathode (IV), such as ITO, electrode(s) (V), such as Pt electrodes, and a substrate (VI), such as sapphire, quartz or glass.
Figure 9B:
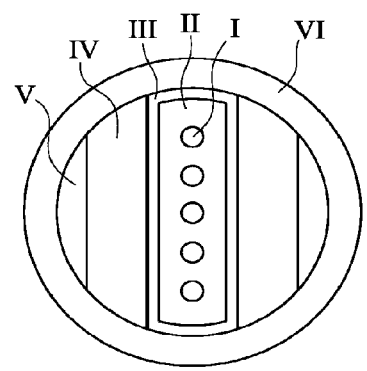

Here, a diode is realized by incorporation of an insulating layer in the device stack, i.e. metal-insulator-semiconductor-metal (MISM) diode. Typical diode layout is shown in FIGS. 9a-9b. However, other configurations may also be possible (including an inverted structure).

In the following we present the data obtained for MISM ZnO diode fabricated with the sputtered thin films of Zn0.75Mg0.15O doped with 40 ppm Al. We used different substrates, e.g. sapphire, quartz and glass. Here only the results of devices fabricated on sapphire substrate are presented. The operation mechanism of the diode is discussed in the later section.

As cathode we used both Al doped ZnO and ITO both sputtered onto the substrate. We note that any metal, or transparent conductive metal-oxide can be used as cathode. ZnO:Al however is advantageous as it provides a good template for ZAM growth. In most of our experiments we used ITO as cathode. Thermal annealing at temperatures ~600° C. was performed to activate the phosphor. Sputtered ITO on glass did show very little degradation in sheet conductivity upon annealing up to 750° C. Conductivity varied from 30 at RT to 75 Ω/square for ITO annealed at 750° C. Glass however, is not stable at T>700° C. Therefore we used either ITO coated sapphire or ITO coated quartz as substrate for ZAM growth and device fabrication.

In the next step we introduced the Pt pad on the ITO-coated sapphire with shadow mask evaporation followed by ZAM deposition. We note that it in our experiments the Pt-cathode pads were masked from the ZAM layer. We do not expect however significant differences if the Pt-contact pads are in touch with the ZAM layer. In the next step either a combination of metal contacts e.g. Ni/Au, or a combination of metal-oxide/metal contacts were introduced as anode. Later annealing of the device was performed to activate the phosphor and to form the contact.

We note that annealing of the devices is another crucial step in device fabrication. In order to fabricate reproducible device, first the contacts were deposited and then annealed at the desired temperature. Subsequent slow cooling down process of the substrate to RT is vital. Rapid cooling of the sample or deposition of contact after annealing, both resulted in devices with symmetric I-V characteristics and no light emission.

Here we present the results obtained with magnesium oxide (MgO), molybdenum oxide (MoOx), vanadium oxide (V2O5) and zirconium oxide (ZrO). We note that the same results were obtained with other insulating blocking layers in combination with different anodes. Moreover ZnO LEDs with the MISM layout can also be fabricated in an inverted structure. An example would be ZAM deposited onto p-type Si with a few nm thick SiOx oxide layer.

Electrical Characterization of ZnO LEDs

In this section we present electrical characteristics of MISM ZnO diodes. Current-voltage characteristics and electroluminescent spectra for sapphire/ITO/ZAM/MgO/Au diode are given in FIGS. 10a-10b. The I-V characteristic of the device, measured in dark, shows that the diode is rectifying. The rectification ratio however is not large due to the leakage current. The primary target here is demonstration of a functional diode and electroluminescence. A photodetector (photo-diode) was placed over the ZnO diode to record the light emission of the device. In dark we measured light with the photo diode. The power dissipated in the ZnO LED was less than 0.5 W, hence just not enough to record a measurable black body radiation. We measured the electroluminescent of the ZnO LED in forward bias of 10 V. The current running through device was 50 mA. An EL spectrum of the device is given in FIG. 8. The PL spectrum of the ZAM is also presented as a reference.

Figure 10A:
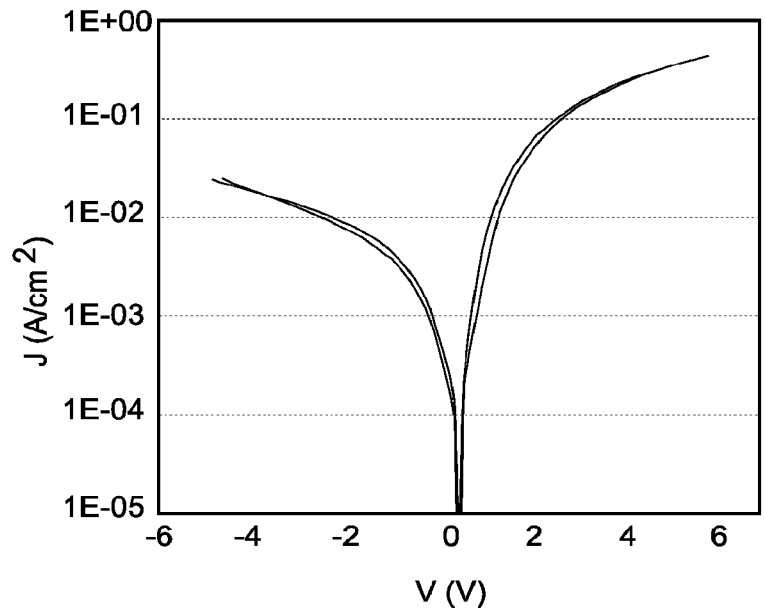
FIGS. 10a (top), 10b (bottom) show.
Figure 10B:
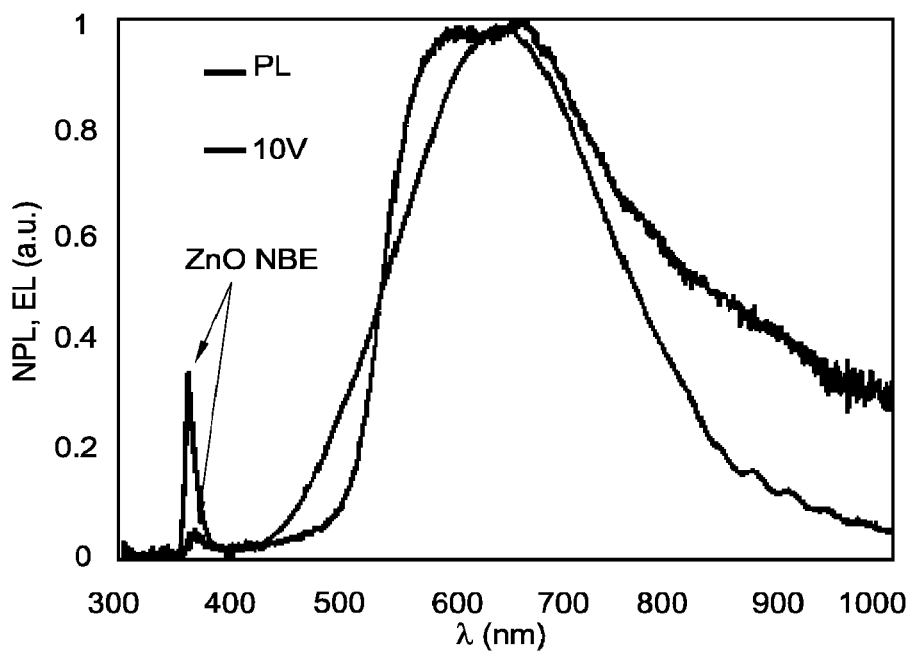
FIG. 10b (bottom) electroluminescent spectra of the diodes driven at 10V and 50 mA. The peak shown with the arrow shows the presence of near-band edge emission (NBE) of ZnO indicating hole injection into ZAM layer.

FIGS. 10a-10b show nice matching of the EL spectrum of the ZnO LED with the PL of the ZAM thin film. It is really intriguing to note that the EL shows a peak at 358-360 nm. This EL peak is exactly at the position where near-band edge emission of the ZnO in thin films of ZAM takes place. Moreover the peak at 670 nm also nicely matches with the emission of the ZAM phosphor. Presence of 358-360 peak unambiguously demonstrate that hole injection is achieved with the MISM structure. The MISM device layout is therefore viable to overcome the challenge that has impeding arriving at ZnO LED for more than 60 years. To further prove that the MISM concept is generic for ZnO LEDs, in the next step we used MoOx as a blocking layer. The device layout therefore was sapphire/ITO/ZAM/MoOx/Au.

Figure 11:
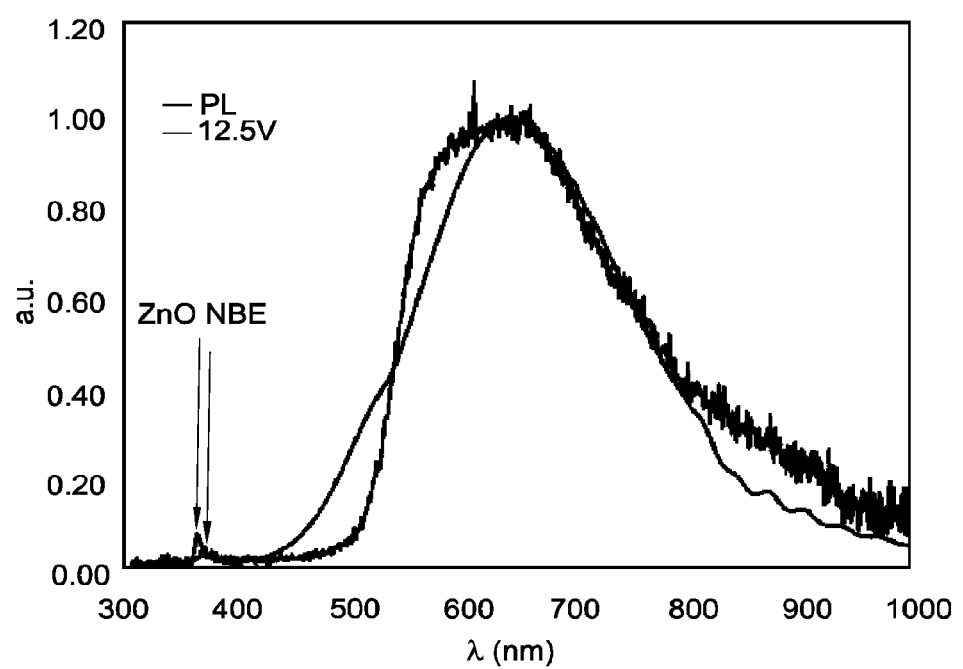
FIG. 11 shows EL spectra of ITO/ZAM/MoOx/Au; ZnO NBE again indicates the near-band edge emission (NBE) of ZnO; the curve that is higher at 500 nm but lower at 900 nm is the PL (thin film) spectrum; the other curve (with more fluctuation on the signal) is the 12.5 V EL spectrum.

In FIG. 11. we have only presented the EL spectra of the device. El was measured at 12.5 V and a good spectral match between the PL of ZnO thin film and EL is achieved. Once again, presence of the near-band edge emission in the EL spectra indicates successful achievement of hole injection into the valance band of the ZnO.

Figure 12A:
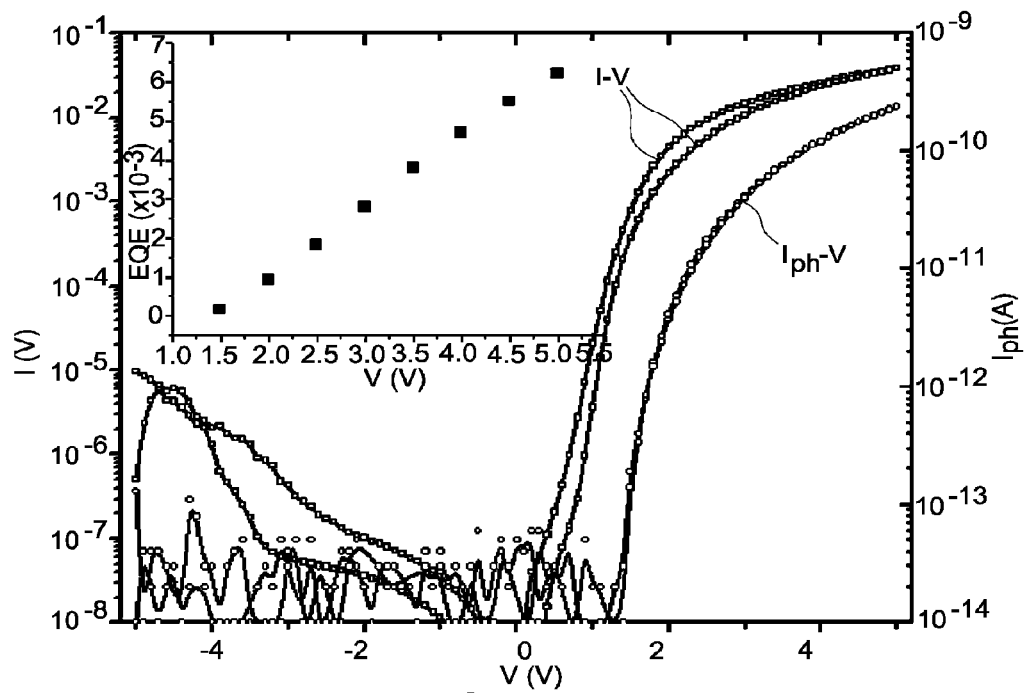
FIGS. 12a (top), 12b (bottom) show I-V characteristics (top) and EL spectra taken at 10 V (bottom) of ZAM devices with a ZrO blocking layer.
Figure 12B:
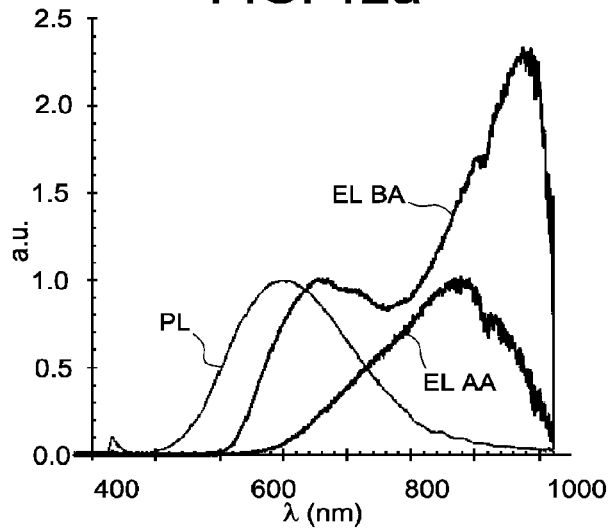
in FIG. 12b, PL refers to photoluminescence, EL BA refers to electroluminescence before annealing and EL AA refers to electroluminescence after annealing.

It is highly desirable to have a blocking layer that first, is stable in air, and second, does not intermixes with the underlying ZnO phosphor layer upon annealing. A good candidate for such layer is ZrO, which is a stoichiometric oxide with very limited solubility in ZnO. ZnO diodes were fabricated with ZrO blocking layer. The device stack was sapphire/ITO/ZAM/ZrO/Au. ZrO layer was sputtered from Zr target in an oxidizing atmosphere. FIGS. 12a-12b. show the I-V characteristics and EL spectra of the respective ZnO diodes. The diodes show an excellent rectification behavior as well as decent light emission. The power dissipated in the diode was ~50 mW. The emitted light therefore cannot be infra-red emission due to heat dissipation, as shown by the EL spectra of the device. EL spectra were recorded before and after annealing of the diode. Before annealing, EL shows a peak at 900 nm, and it is not due to heat dissipation. Upon annealing, several peaks appear in the EL spectra of the device, with the first peak being at ~650 nm. In comparison with the PL spectra of the thin-film with ZrO layer on top, it seems that the main emission peak at 600 nm is red shifted. Moreover the near band edge emission peak of the ZAM layer is not present in the EL spectra. Additionally few other peaks are present in the EL. We believe that sputtering of the ZrO layer on to ZAM has caused damages at the ZAM/ZrO interface. Due to soft bombardments of the ZAM interface, shallow diffusion of the Zr or ZrO into the ZAM layer could potentially change the EL spectrum by causing more surface recombination, which is manifested by appearance of the new peaks. Physical vapour deposition of ZrO (and potentially all the blocking layers) onto the ZAM layer is therefore recommended for having good spectral match.

The EL-spectra presented here are among the first EL spectra reported for ZnO LEDs. The I-V characteristics and EL spectra achieved for the ZnO LEDs demonstrate the viability of the MISM device layout.

Light-Emission Mechanism of ZnO LEDs

Figure 13:
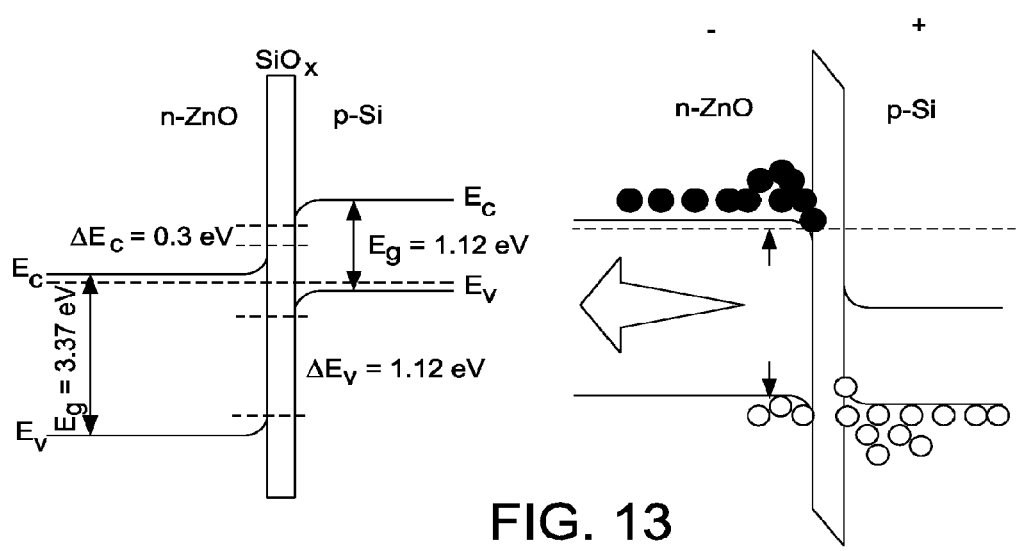
FIG. 13 schematically shows an embodiment of energy band diagrams of the n-ZnO/SiOx/p-type Si diodes under thermal equilibrium (left) and positive bias at Si side (right).

A tentative mechanism is presented in FIG. 13 for the MISM stack with highly p-type doped Si as the anode and SiOx as the blocking contact. Similar mechanism is at work when p-type Si is replaced with a metal electrode as anode.

The energy band diagrams of the diode at equilibrium and under bias are shown. When positive forward bias is applied on the anode, here p-type Si, the bands of Si near the Si/SiOx interface will bend upward. The band bending at the Si/SiOx interface will gradually induce an inversion layer for n-ZnO/SiOx/p-Si diodes, which is responsible for the hole injection. As a result, accumulated holes in the inversion layer could tunnel through the barrier into the valence band of ZnO and recombine with the electrons in ZnO conduction band that are blocked by the SiOx interface layer, resulting in UV emission of 359 nm as well as the visible emission at 600 nm.

A zinc oxide light emitting diode based on a newly developed zinc oxide phosphors has been demonstrated. These phosphor thin film showed visible emission. The phosphors proved robust to thin layer deposition techniques such as PLD and RF sputtering. Annealing in air at elevated temperatures (400-1100° C.) was favorable to increase the photoluminescence and initiate the electroluminescence. To fabricate ZnO LED we used a blocking layer between the anode and the emissive layer. The blocking layer impedes the electron to arrive at the anode from the ZnO layer. Accumulation of the electron enhances hole injection and hence the LED begin the light emission.

The recorded electroluminescence and the photoluminescence spectra of the ZnO thin film and ZnO LED match nicely. Interestingly even band gap emission of the ZnO is present in the EL spectra, which indicates that hole injection has been successfully achieved by incorporation of the blocking layer. The enhanced emission in ZnO thin layer could not be attributed to direct emission of the additives, but is thought to stem from radiating defects in the ZnO lattice, most likely oxygen-related. Only band edge excitation was observed, which was further corroborated by CL, showing that these phosphors operate through energy absorption by the host material, followed by energy transfer to the radiant defect and subsequent emission. The combination of the material and device presented here makes ZnO phosphors an attractive potential candidate for the large area LEDs.

As insulating layers, SiO2, MgO and ZrO were tried, and they all worked.

The invention claimed is:

1. A method for producing a light emitting semiconductor device, the method comprising:
    providing a support,
    forming a stack on the support,
    wherein the stack comprises a cathode, a semiconductor layer comprising an emissive material configured to emit in the range of 300-900 nm, an insulating layer, and an anode, wherein the cathode is in electrical contact with the semiconductor layer, wherein the anode is in electrical contact with the insulating layer, wherein the insulating layer has a thickness in the range of up to 50 nm, wherein the semiconductor layer comprises aluminum doped zinc magnesium oxide layer having 1-350 ppm Al.

2. The method according to claim 1, further comprising:

forming the cathode on the support, forming the semiconductor layer on the cathode, forming the insulating layer on the semiconductor layer, forming the anode on the insulating layer, followed by annealing the stack, wherein annealing is performed at a temperature in the range of 400-1100° C.

3. The method according to claim 1, wherein the emissive material has a conduction band at CBp eV and a valence band at VBp eV from the vacuum level, with CBp>VBp, wherein the insulating layer has a conduction band at CBb eV and a valence band at VBb eV from the vacuum level, with CBb>VBb, wherein CBb>CBp and wherein VBb≤VBp+1.5 eV.

4. The method according to claim 1, wherein the semiconductor layer comprises an emissive material selected from the group consisting of ZnO, (Zn,Mg)O, ZnS, ZnSe, CdO, CdS, CdSe, and doped variants of any of these, and wherein the insulating layer is selected from the group consisting of $SiO_2$, MgO, $SrTiO_3$, $ZrO_2$, $HfO_2$, and $Y_2O_3$.

5. The method according to claim 1, wherein the semiconductor layer comprises an emissive material, wherein the formation of the semiconductor layer comprises a deposition technique selected from the group consisting of pulsed laser deposition (PLD) and radio frequency (RF) sputtering, wherein the semiconductor layer has the nominal composition $Zn_{1-x}Mg_xO$ with 1-350 ppm Al, wherein x is in the range of $0<x\leq0.3$.

6. The method according to claim 1, wherein the semiconductor layer is polycrystalline.

* * * * *